United States Patent [19]
Morris et al.

[11] Patent Number: 5,223,449
[45] Date of Patent: Jun. 29, 1993

[54] METHOD OF MAKING AN INTEGRATED CIRCUIT COMPOSED OF GROUP III-V COMPOUND FIELD EFFECT AND BIPOLAR SEMICONDUCTORS

[76] Inventors: Francis J. Morris, 1036 Sunswept, Plano, Tex. 75075; Donald L. Plumton, 3230 Dartmoor, Dallas, Tex. 75229; Jau-Yuann Yang, 429 Provincetown La., Richardson, Tex. 75080; Han-Tzong Yuan, 7131 Birchwood Dr., Dallas, Tex. 75240

[21] Appl. No.: 692,326

[22] Filed: Apr. 26, 1991

Related U.S. Application Data

[60] Division of Ser. No. 554,116, Jul. 18, 1990, Pat. No. 5,068,756, which is a continuation of Ser. No. 312,101, Feb. 16, 1989, abandoned.

[51] Int. Cl.5 .................. H01L 21/265; H01L 21/70
[52] U.S. Cl. ......................................... 437/51; 437/59; 437/56; 437/133; 148/DIG. 9; 148/DIG. 72
[58] Field of Search .................. 437/51, 59, 34, 133, 437/56, 126, 51; 148/DIG. 9, DIG. 72

[56] References Cited

U.S. PATENT DOCUMENTS 4,981,807 1/1991 Tambotkar ................. 148/DIG. 72
5,015,594 5/1991 Chu et al. ............................... 437/34

Primary Examiner—Brian E. Hearn
Assistant Examiner—Tuan Nguyen

[57] ABSTRACT

Integrated circuits and fabrication methods incorporating both NPN (192, 194, 210) and PNP (196, 121, 124) heterojunction bipolar transistors together with N channel (198, 200, 216, 218) and P channel (202, 204, 220, 222) JFETs on a single substrate as illustrated in FIG. 10. MESFETs may be also be integrated on the substrate.

16 Claims, 34 Drawing Sheets

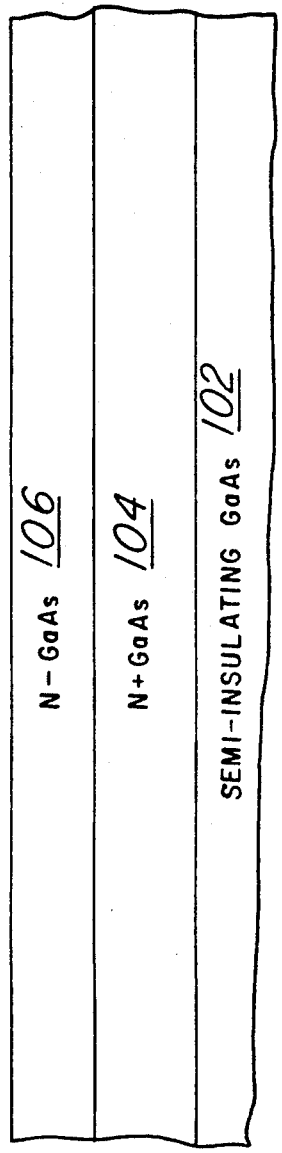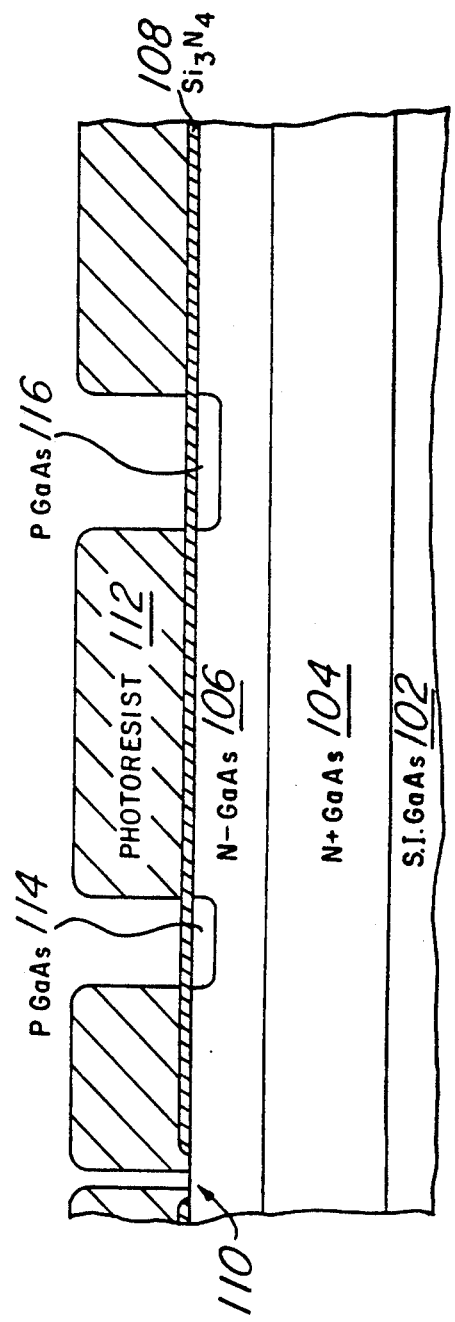

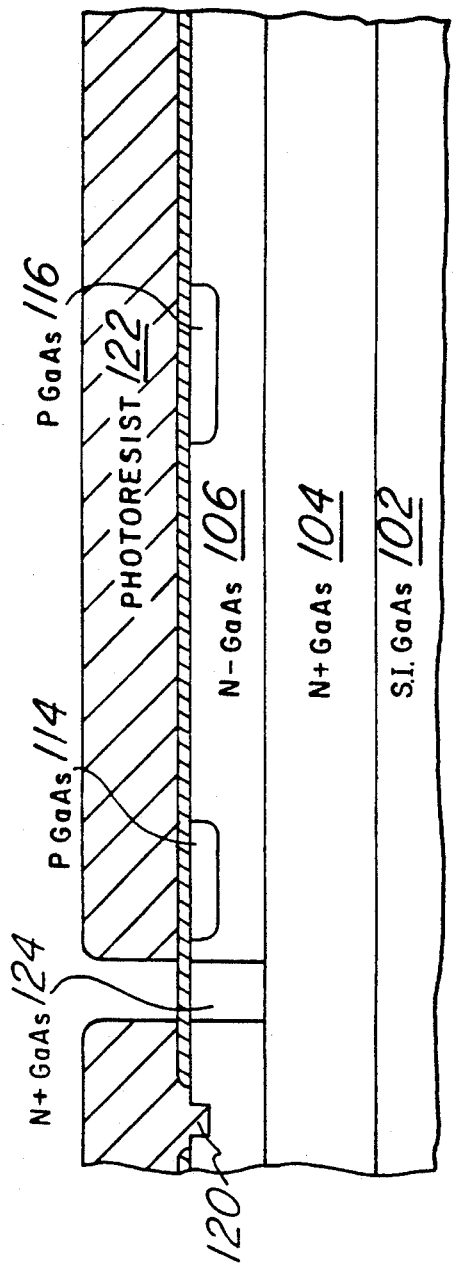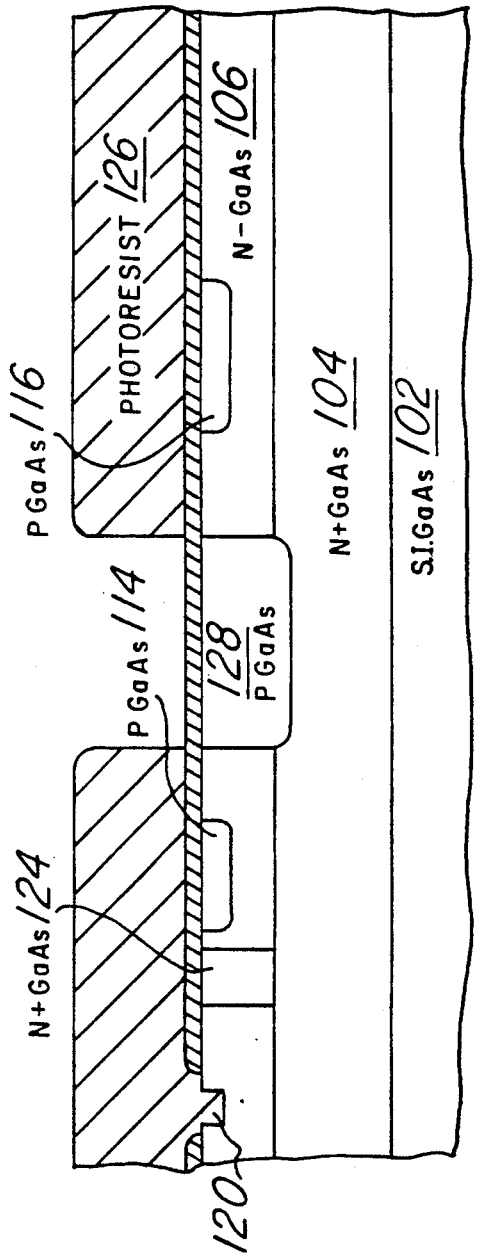

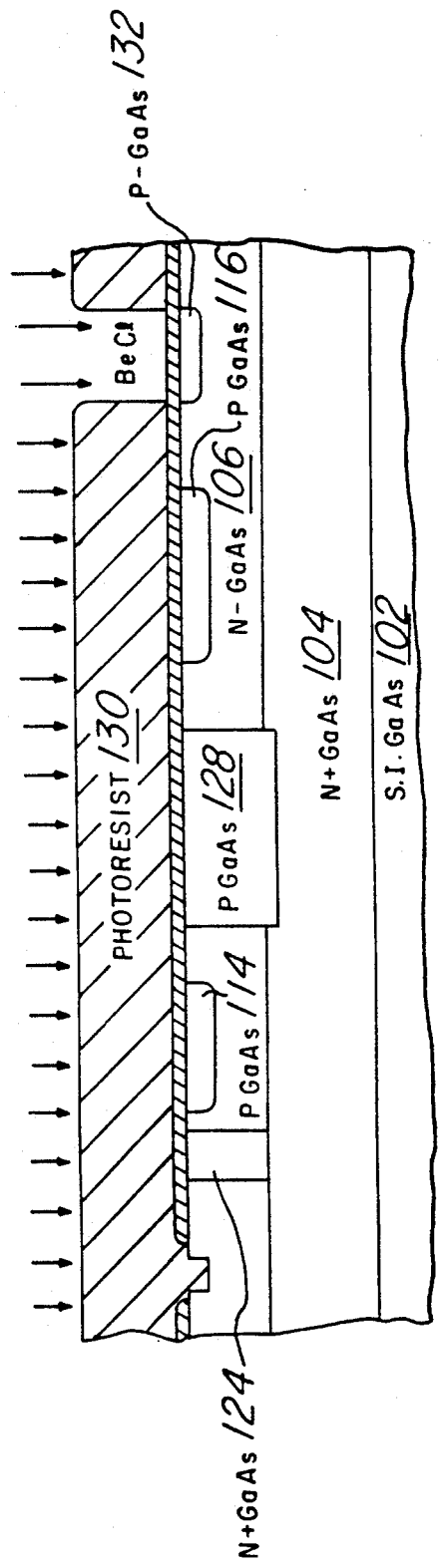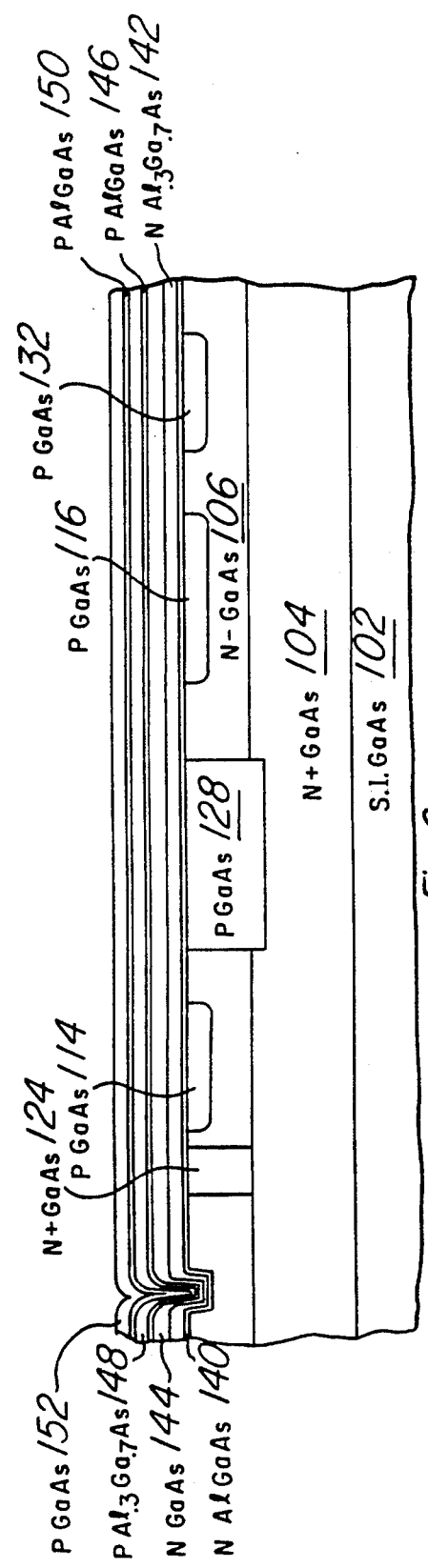

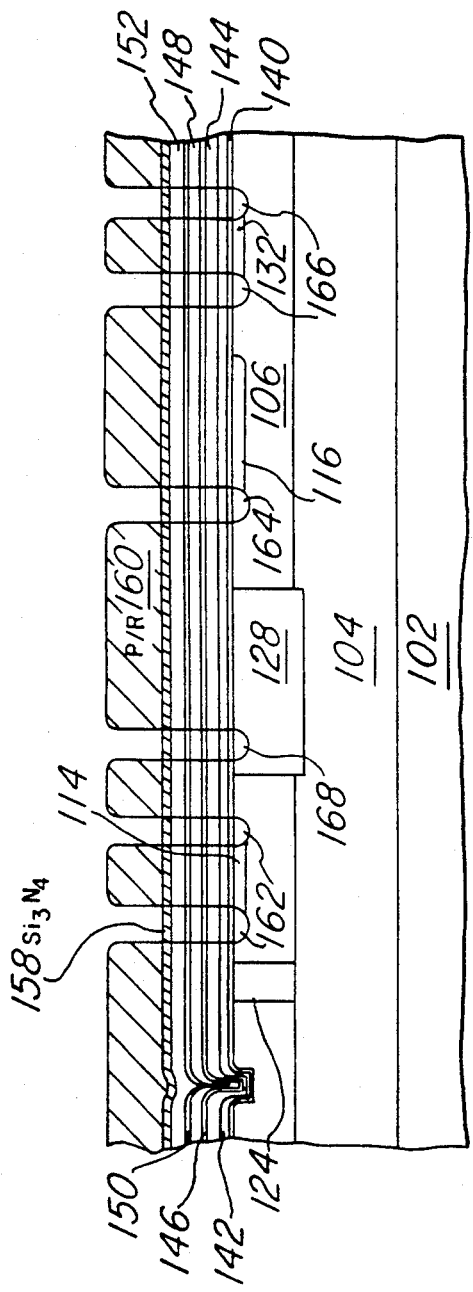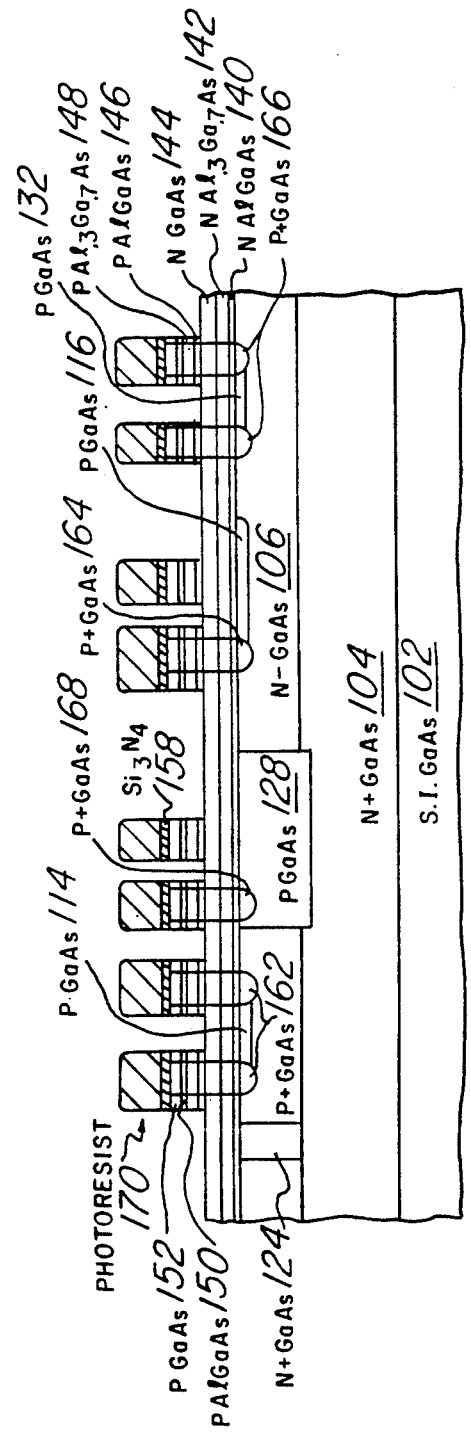
Fig.7
Fig.8

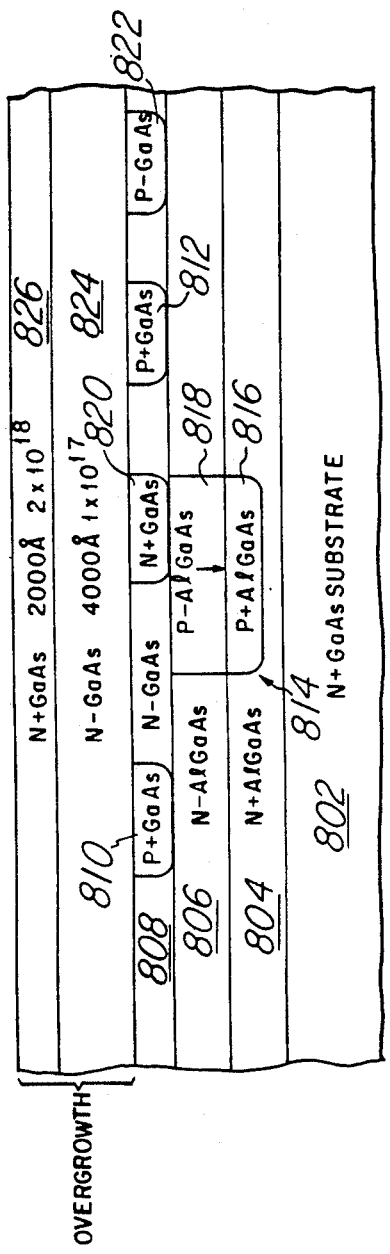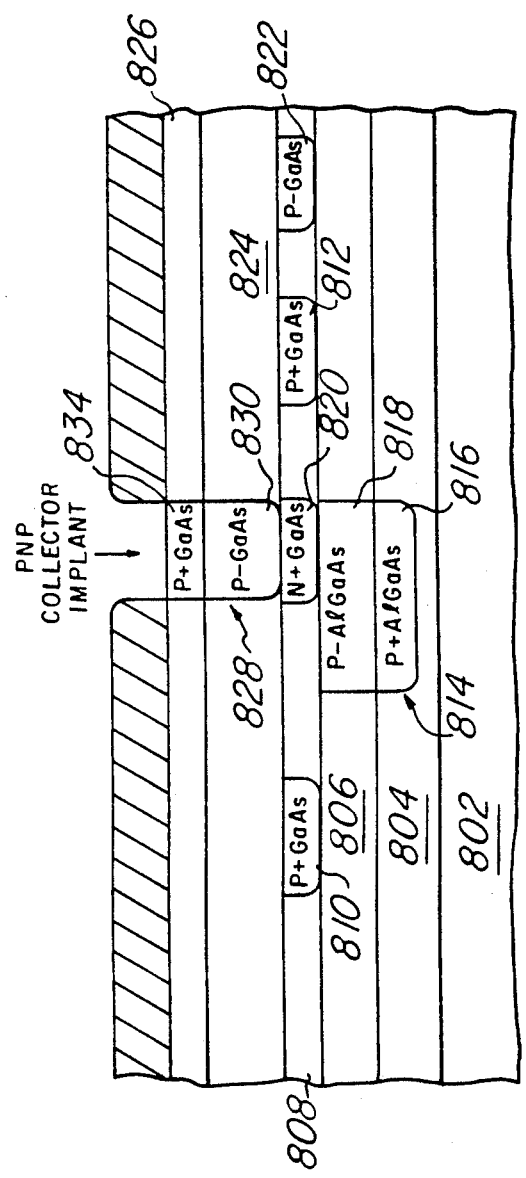
Fig. 42
Fig. 43

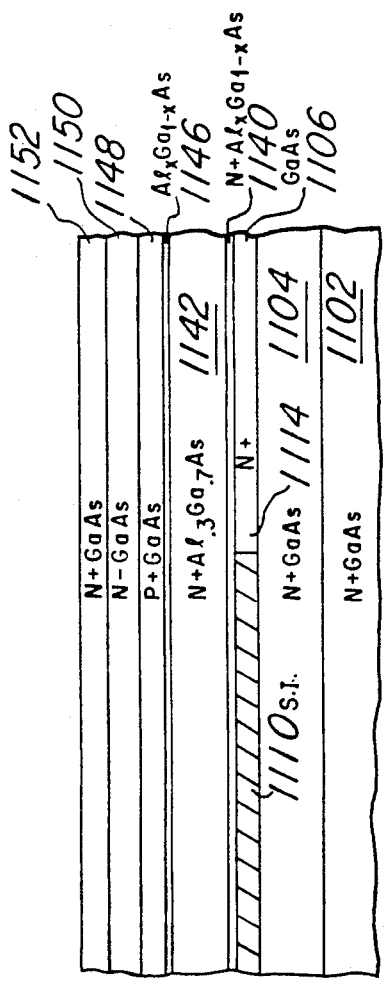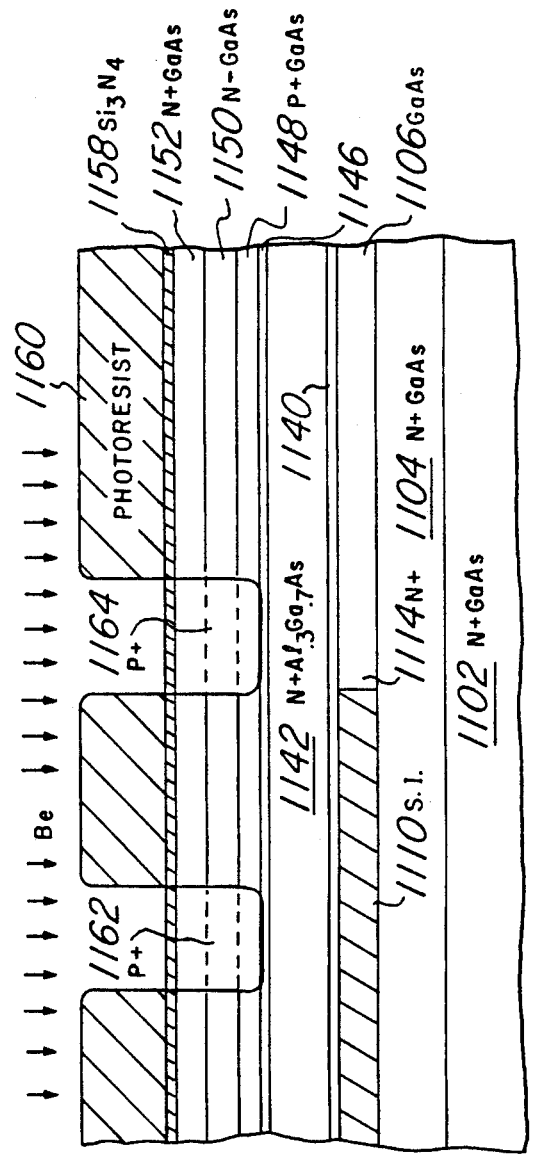
Fig.60
Fig.61

METHOD OF MAKING AN INTEGRATED CIRCUIT COMPOSED OF GROUP III-V COMPOUND FIELD EFFECT AND BIPOLAR SEMICONDUCTORS

This application is a division of application Ser. No. 07/554,116, filed Jul. 19, 1990, now U.S. Pat. No. 5,068,756 which is a continuation of Ser. No. 07/312,101, filed Feb. 16, 1989 now abandoned.

CROSS-REFERENCE TO RELATED APPLICATIONS

U.S. patent application Ser. Nos. 07/063,554, filed Jun. 18, 1987 (L. Tran), 07/107,234, filed Oct. 9, 1987 (Plumton et al), and Ser. No. 07/312,100 filed Feb. 16, 1989 (Bayraktaroglu) disclose related subject matter. All of these cross-referenced items are assigned to the assignee of this application, and are both now abandoned.

BACKGROUND OF THE INVENTION

1. Field of the Invention

The present invention relates to semiconductor electronic integrated circuits, and, more particularly, to integrated circuits made of group III-V compound semiconductors including both field effect and bipolar devices.

2. Description of the Related Art

Improved performance as well as increased circuit flexibility is made possible by integrating both NPN and PNP bipolar transistors on the same chip. Silicon digital circuits make use of vertical NPN switching transistors as well as lateral PNP transistors for input logic, current sources and level shifting. The addition of junction field effect transistors (JFETs) with silicon bipolar transistors result in analog circuits which operate at high speeds while offering very high input impedances. The versatility of combining bipolar circuits and JFETs in an integrated circuit is well known. Further, the integration of silicon CMOS and bipolar transistors (BICMOS) to combine the density of CMOS with the high drive of bipolar has appeared in commercial products.

Historically GaAs/AlGaAs heterojunction bipolar transistors (HBT) have been fabricated using mesa technology in which the collector, base and emitter epi layers are sequentially grown during a single epitaxial deposition run. The emitter and base epi layer are selectively removed using two etch steps for making contact to the base and collector areas, respectively. These etches result in steps in the GaAs ranging in height between 0.4 and 1.0 micron for a typical mesa HBTs. See for example, K. Nagata et al, Self-Aligned AlGaAs/GaAs HBT with Low Emitter Resistance Utilizing In GaAs Cap Layer, 35 IEEE Tr.Elec.Dev. 2 (1988). Although high quality HBTs can be fabricated in this manner, the resulting mesa structure results in very severe topography, making it difficult to incorporate a multilevel metal system as required for high levels of integration.

Planar heterojunction bipolar transistors have been fabricated as elements of integrated circuits in the emitter down configuration; see for example, McLevige et al, U.S. Pat. No. 4,573,064 and L. Tran et al, GaAs/AlGaAs Heterojunction Emitter-Down Bipolar Transistors Fabricated on GaAs-on-Si Substrate, 8 IEEE Elec.Dev.Lett. 50 (1987). This avoids the mesa topography but has the drawbacks of limited NPN base doping and limited multiple device integration possibilities. The deep base implant through the collector limits the base doping resulting in a high base sheet resistance and a "flat" doping profile. An emitter up version appears in Gabriel et al, U.S. Pat. No. 4,672,414. And an integration possibility appears in copending application Ser. No. 063,554, filed Jun. 18, 1987 (L. Tran) where an N-channel JFET is integrated with the NPN. To integrate any more devices would require major changes in the epi and many additional processing steps. In addition, this technology requires all of the NPN transistors to be connected in the common emitter configuration which severely limits its applications.

Although a single epitaxial deposition run as used in the foregoing mesa HBTs and emitter-down HBTs does simplify the fabrication process, it limits the types of structures which can be integrated together on a single chip.

J. Tully, 7 IEEE Elec.Dev.Lett. 203 (1986) and J. Tully et al, 7 IEEE Elec.Dev.Lett. 615 (1986) grow an emitter epilayer onto an implanted base with Zn as the base dopant because of the high mass and low implant range. However, implanted Zn is difficult to activate at low temperatures. Raising the temperature high enough for good activation results in excessive diffusion due to the large diffusion coefficient for Zn, significantly increasing the base width and lateral dimensions and degrading the frequency response. Additionally, Tully integrates only a single type of device, the NPN HBT.

SUMMARY OF THE INVENTION

The present invention provides devices, integrated circuits, and fabrication processes which includes more than one epitaxial deposition but provides simultaneously both field effect (MESFET and JFET) and NPN and PNP bipolar transistors in an essentially planar circuit. In preferred embodiments, a GaAs wafer is deposited with an epitaxial film which may be made of several sequential doped layers; the wafer is then selectively implanted with a suitable dopant or the epitaxial layers may be selectively etched as in the case of the mesa devices. After this processing, the wafer is cleaned and a second epitaxial layer is deposited. The implant/etch followed by epitaxial deposition may be repeated a number of times. The specific epitaxial deposition process may be MBE or MOCVD or other deposition processes.

The present invention also provides a method where an implant spacer layer is used which makes the use of Be for the base dopant possible. Additionally, BeCl could be used to obtain a shallow implant profile and still have the well behaved Be as a dopant.

BRIEF DESCRIPTION OF THE DRAWINGS

The drawings are schematic for clarity.

FIGS. 1-10 are cross sectional elevation views of the steps of a first preferred embodiment method;

FIGS. 37-48 illustrate the steps of an eighth preferred embodiment method;

FIGS. 58-64 are cross sectional elevation views of steps of a thirteenth preferred embodiment method and structure;

DESCRIPTION OF THE PREFERRED EMBODIMENTS

Figure 9:
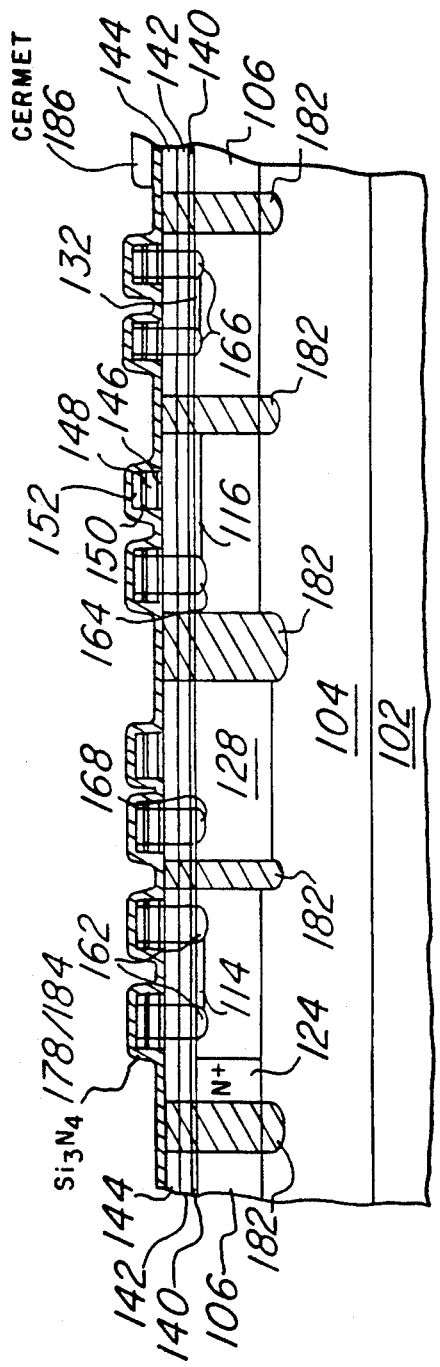
Figure 10:
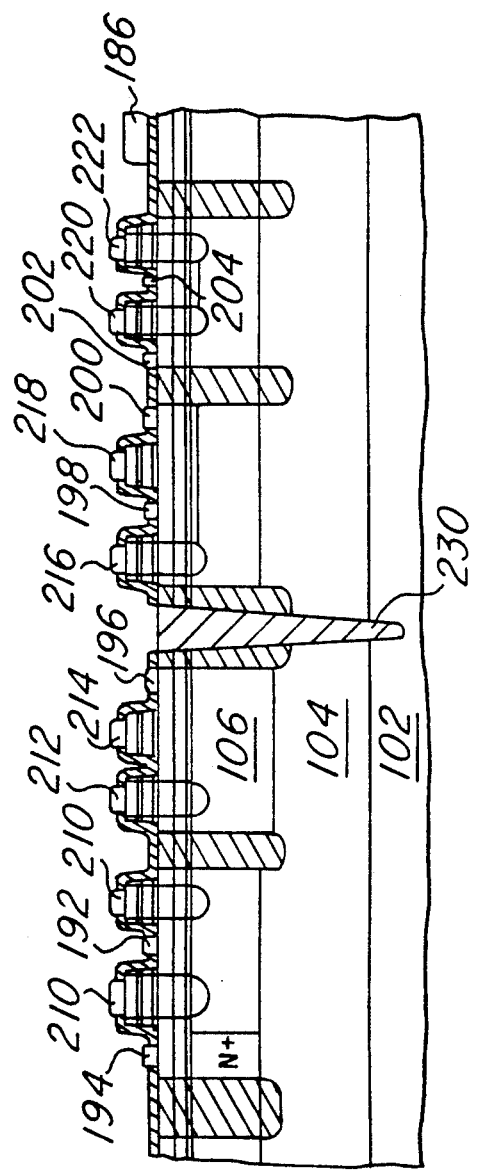

The present invention provides for the integration of MESFETs (both enhancement and depletion mode), N−channel and P−channel JFETs, and NPN and PNP isolated (heterojunction) bipolar transistors with either emitter-up or emitter-down plus common emitter-down useful for HI²L. The preferred embodiment devices and integrated circuits and fabrication methods are described primarily in terms of the device fabrication steps with such steps as interconnection metallization, passivation, and packaging omitted for clarity.

A first preferred embodiment method for simultaneously fabricating NPN and PNP heterojunction bipolar transistors (HBTs) and N−Channel and P−Channel JFETs includes the following steps as illustrated in cross sectional elevation views in FIGS. 1-10:

(a) A starting material for this process is shown in FIG. 1. It is composed of a semi-insulating GaAs substrate (not shown) on which buffer layer 102 of GaAs is grown followed by approximately one micron thick layer 104 of N+ GaAs and 0.6 micron thick layer 106 of N− GaAs which will form the collector regions of the NPN HBT's. The N+ layer 104 doping is typically $2\times10^{18}/cm^3$ but any value in excess of about $2\times10^{17}/cm^3$ could be used providing it meets the collector resistance requirement. The thickness and doping of N− layer 106 is determined by the breakdown voltage requirements of the NPN HBTs. Increasing the thickness tends to increase the breakdown voltage while increasing the collector resistance. Increasing the doping of the N− layer increases the NPN collector-base capacitance, increases the maximum $f_t$ and decreases the collector resistance. A trade-off-analysis is needed for each specific application. Note that FIG. 1 and all of the Figures have the vertical exaggerated for clarity; for example, the emitter of an NPN HBT would have an area of about seven microns by seven microns but a thickness of less than 0.2 microns (see step (c) below).

(b) The layered substrate is then coated with a 400 A thick layer of silicon nitride ($Si_3N_4$) 108, photoresist is spun on and patterned and nitride 108 is plasma etched with the patterned photoresist as etch mask in regions 110 where alignment marks are to be formed. The photoresist mask is then removed.

(c) The layered substrate is then again covered with photoresist which is patterned. The patterned photoresist 112 is then used as an implant mask and dopants are implanted through the thin nitride with a P−type dopant such as beryllium to form regions 114 which will form the NPN bases and in regions 116 in which the N-channel JFET's are to be formed. The P−type implanted regions 116 form the backgate for the N−channel JFET's. The energy of the P−type dopant and the thickness of nitride layer 108 specified in step (b) are adjusted to give the desired base doping profile with the peak concentration of the implant near the nitride 108-GaAs 106 interface and the resulting junction depth less than about 2000 A; see FIG. 2. The implant energies typically range between 30 KeV and 120 KeV while the typical doses range between $5\times10^{12}/cm^3$ and $1\times10^{14}/cm^3$. Note that $Be^+$ is a fairly light ion, so $BeCl^+$ or other ionized halogen compounds of Be could be used to increase the mass of the implanted ion and thereby permit shallower implants.

(d) With the NPN base implant mask 112 still in place, the layered substrate is then subjected to a GaAs etch (such as 1:8:160 $H_2SO_4:H_2O_2:H_2O$) to define the alignment marks 120 in the GaAs. The only areas which are etched are those in which a pattern exists in the base level implant mask 112 which are also nested inside the holes 110 previously etched in nitride 108 level. These patterns etched in the GaAs 106 provide permanent alignment marks allowing subsequent levels to be aligned to the NPN base. These alignment marks 120 could be incorporated in any other level with appropriate process changes to make it possible to align critical geometries to the most critical level.

(e) After stripping photoresist 112 a new patterned photoresist 122 which exposes the NPN collector contact areas 124 is formed on nitride 108. The layered substrate is then implanted through nitride 108 with silicon dopants using photoresist 122 as the implant mask. The implant energy and dose are adjusted to form a low resistivity connection through N− epi layer 106 down to N+ epi layer 104 to insure low internal NPN collector resistance. See FIG. 3.

(f) Photoresist 122 is stripped and another patterned photoresist 126 is formed on nitride 108. A p−type dopant such as beryllium is then implanted through nitride 108 using patterned photoresist 126 as the implant mask as indicated in FIG. 4 to form PNP collector region 128. The energy and dopant flux is adjusted to insure that the N−epi layer 106 is converted to P−type in the implanted regions 128. The energy can and be adjusted to convert not only the N− epi region to P−type but part of N+ epi 104 can also be converted to P−type to further lower the PNP collector resistance. The optimum p-dopant profile would be to just compensate the n-dopant at the interface with the p−type doping density increasing with depth. This profile would minimize the base-collector capacitance of the PNP and maximize its breakdown voltage. The depth of the PNP collector region is limited to the implant range of the p−type dopant. Using a 400 KeV implanter the range of beryllium is approximately one micron. By using one or more implant doses and energies, the collector doping profile can be tailored to yield the required breakdown voltage and collector resistance. An alternative process for lowering the PNP collector sheet resistance will be described as one of the other preferred embodiments.

(g) Photoresist 126 is stripped and patterned photoresist 130 is formed on nitride 108 and used as the implant mask for implanting a P−type dopant such as beryllium through nitride 108 into the N− epi layer 106 to form the P−channel 132 for P−channel JFETs as indicated in FIG. 5. The implant range and flux is adjusted to get the desired Idss and pinch-off voltage. Dopants such as $BeCl^+$, Mg and zinc can also be used to obtain P—channels which are shallower than obtainable with beryillum for lower pinch-off voltages.

(h) Photoresist 130 is stripped, the layered substrate is throughly cleaned, nitride layer 108 removed by etching in hydrofluoric acid and the layered substrate is then recleaned in preparation for the next epi deposition process. It is essential that the surface of the layered substrate be void of any nitride or other foreign materials to insure that the second epi deposition results in high quality epitaxial growth.

(i) A second MOCVD epi deposition, which is performed at temperatures in excess of 700 C. in an overpressure of arsenic, anneals the previously described implants resulting in good electrical activation. As an alternative annealling process, the substrate can be annealed in a conventional furnace or rapid thermal annealer prior to the subsequent epi deposition.

The specific layer composition deposited during the second epi deposition depends on which of the four types of devices, i.e., NPN, PNP, N-JFET and P-JFET, are to be fabricated and which type of device must have its performance optimized. As a general rule all of the device types cannot be optimized at the same time since they have conflicting requirements in some cases. For the purposes of an example, it will be assumed that the NPN HBT and the N—channel JFET performance must be optimzed for a particular application. For this case a typical composition of the second epi deposition starting with the layer adjacent to the original N— epi layer is as follows:

| Layer | Thickness | Description/Function |
|---|---|---|
| 140 | 300A | graded $Al_xGa_{1-x}As$ region in which the aluminum composition x is varied from zero to 0.3 and the silicon doping is held constant at 2E17/cm3. Function is to smooth the bandgap transition between GaAs and AlGaAs |
| 142 | 1000A | N-type $Al_xGa_{1-x}As$ layer with x = 0.3 doped with silicon to 2E17/cm3. This layer forms the emitter for the NPN HBT and is part of the channel for the N-Channel JFET and forms the gate for the P-channel JFET. |
| 144 | 1000A | N-type GaAs layer doped with silicon to 2E17/cm3. This layer is used to make ohmic contact to the NPN Emitter and Collector as well as forms the conducting channel for the N-Channel JFET and the base for the PNP. |
| 146 | 300A | graded P-type $Al_xGa_{1-x}As$ with aluminum concentration varied between zero at the previous N—GaAs surface to 0.3 while the p- dopant (typically zinc) concentration is held constant at 2E17/cm3. Function is to smooth the bandgap transition between GaAs and AlGaAs. |
| 148 | 1000A | P-type $Al_xGa_{1-x}As$ layer with x = 0.3 concentration doped with 2E17/cm3 zinc. This layer forms the emitter of the PNP transistor as well as the top gate for the N-channel JFET. |
| 150 | 300A | Graded P-type $Al_xGa_{1-x}As$ layer in which the aluminum concentration is varied from x = 0.3 to x = 0 as the layer is grown. The P-type doping is held constant at 2E17/cm3. Function is to smooth the bandgap transition between AlGaAs and GaAs |
| 152 | 1000A | P-type GaAs doped with 2E17/cm3 zinc. This layer is used to make ohmic contact to the PNP emitter and collector, the gate of the N-Channel JFET and base of the NPN. |

The addition of thin (100-300 A) un-doped buffer layers between the HBT base layers and the emitter layers may be included but are not given in this table for simplicity. All of these layer thicknesses and doping densities are only given as examples. Increases or decreases in the layer thickness by a factor of two or more are well within the useful range. N—type doping densities for the various layers in the range of $1 \times 10^{17}$/cm3 to $2 \times 10^{18}$/cm3 and P—type doping densities in the range of $1 \times 10^{17}$/cm3 to $2 \times 10^{19}$/cm3 can be used to optimize the various device parameters. For example, if one chooses to optimize the NPN, PNP and P—channel JFET parameters at the expense of the N—channel JFET, the N—type doping levels would be increased from $2 \times 10^{17}$ to $1-2 \times 10^{18}$/cm3. The P—type layer doping densities could be increased to improve the ohmic contacts and PNP emitter efficiency at the expense of increased capacitance and potential contamination due to the high diffusion rate of zinc. See FIG. 6.

(j) After the growth of the epitaxial layers 140, 142, . . . , 152 is completed, the layered substrate is again coated with 400 A thick nitride layer 158. The substrate is then patterned with photoresist 160 which exposes the NPN extrinsic base areas, the P—channel source and drain regions, and the contact area for the N—channel back gate. A P—type dopant such as beryllium is implanted through the nitride layer 158 using photoresist 160 as a mask to form heavily doped P+ regions 162 extending from the surface down to the NPN base region 114, P+ region 168 extending from the surface down to the PNP collector region 128, P+ region 164 extending from the surface down to the N—channel backgate 116, and P+ regions 166 extending from the surface down to the P—channel 132 for forming P—type source and drain contact regions at the surface of the layered substrate. This implant may be composed of several different implants with different energies and doses to tailor the profile to insure a high surface p—type dopant concentration for good ohmic contacts. See FIG. 7.

(k) Photoresist 160 is then stripped from the layered substrate, and patterned photoresist 170 is applied to cover all regions in which a P—type region is desired at the surface. This includes the PNP emitter and collector areas, the NPN base contact regions, the P—channel source and drain, and the N—channel gate areas. The exposed portions of nitride 158 are then etched away using a plasma process (such as CF4/O2) exposing portions of the P—type GaAs 152 surface. Using (1:8:160) etchant the P—type GaAs/AlGaAs layers 152, 150, 148, and 146 are then etched from the exposed surfaces. This etch depth is not critical and some overetching of the p—layers is performed to insure that all of the exposed portions of the P—type layers are removed and that the remaining exposed GaAs surface is composed of only N—type GaAs 144. See FIG. 8.

(l) The remaining photoresist 170 and nitride 158 are then stripped from the layered substrate and a new 400 A thick conformal plasma nitride layer 178 is deposited.

(m) The P+ implant of step (j) is annealed typically in a rapid thermal annealer although a furnace anneal could be used. The use of the rapid thermal annealer (RTA) provides good activation while limiting the time at elevated temperatures to less than a few minutes to minimize the movement of the dopants due to diffusion. A two step RTA process as disclosed in U.S. Pat. No. 4,743,569 is used for this anneal process.

(n) The layered substrate is patterned with photoresist 180 (not shown) for isolation implant. Photoresist 180 covers only the active regions of the various transistors, and boron is implanted through nitride 178 with photoresist 180 as implant mask; the implant damages the GaAs/AlGaAs crystal lattice in regions not protected by photoresist 180 and converts the implanted regions to semi-insulating regions 182.

(o) Photoresist 180 is stripped and the layered substrate is then cleaned and a new conformal plasma nitride layer 184 (2000-3000 A thick) is deposited. A 3000 A thick layer 186 of resistive material such as cermet (CrSiO2) is sputtered onto the nitride 184, annealed using the rapid thermal annealer, and patterned to form required resistors. After the anneal the sheet resistance of the cermet 186 is approximately 300 ohms/square although other materials and sheet resistances can be used depending on the circuit requirements; see FIG. 9.

(p) Photoresist mask layer 190 (not shown) is then patterned on the layered substrate exposing nitride 178/184 in all of the regions where it is desired to form ohmic contacts to the N−surface regions including the NPN emitter and collector, PNP base, P-JFET gate regions, and the N−channel JFET source and drains. Nitride 178/184 is removed from these regions using a plasma etch of CF4/O2 with photoresist 190 as etch mask. Following the etch a wet chemical clean-up is used which maintains photoresist 190 intact. A gold/germanium (or other contact metal system) ohmic contact metallization is deposited onto the layered substrate and using a photoresist 190 assisted lift-off, the ohmic metal is removed except in regions where the contact openings have been etched in the nitride. Using a rapid thermal annealing process, the contact metal is annealed at 400-500 C. and forms NPN emitter contact 192 and collector contact 194, PNP base contact 196, N−channel source 198 and drain 200, and P−channel backgate contact 202 and gate contact 204. See FIG. 10.

(q) Photoresist 190 is stripped and the layered substrate patterned with photoresist 208 (not shown) which exposes the regions in which P−type ohmic contacts are to be made which includes the NPN base regions, the PNP emitters and collectors, the P-JFET source and drain regions and the N-JFET gate regions. Nitride 178/184 is plasma etched followed by a contact clean-up. This is followed by a P-ohmic metallization process similiar to the previously described N-ohmic process except that the deposited metal is a combination of layers of gold/zinc. This forms NPN base contacts 210, PNP collector contact 212 and emitter contact 214, N−channel backgate contact 216 and gate contact 218, and P−channel source contact 220 and drain contact 222. The temperature used for the contact anneals and cermet anneals are sufficiently low temperature that the implant damage used to convert the field area to semi-insulating is not annealed out. If higher anneal temperatures are needed for other metalization systems or resistor materials, the boron damaging implant can be delayed in the process until after all the heat cycles have been completed. See FIG. 10.

(r) The contact metal system is again repeated in regions where Schottky barrier diodes are to be fabricated. Titanium followed by platinum and gold is deposited and lifted off using the previously described process. No contact anneal is used for the case of the Schottky diodes.

(s) At this point in the process the collectors of all of the NPN transistors and the backgates of the P−channel JFETS are connected together through the N+ and N− epi regions. To isolate the various transistors, a narrow 1-2 micron wide moat (trench) will be etched through the various epi layers into the semi-insulating GaAs substrate completely encirculing each of the transistors. (Note: More than one transistor can be placed inside the same moat to save area if the transistors do not need to be electrically isolated from each other). The trench is then filled in with nitride so that metal interconnect can be used to connect the various transistors together into the required circuit. This trench process may be accomplished in the following manner.

(s.1) Following the ohmic and Schottky metal processes, the layered substrate is coated with a 500 A layer of plasma nitride to protect the previous metal depositions. A layer of aluminum is then deposited. Using photoresist the trench mask is patterned over the aluminum. The back side of the layered substrate is protected and the aluminum is etched from the trench region. The exposed nitride (typically 3500 A thick) is plasma etched from the trench region. Using the photoresist as a mask the exposed GaAs is ion milled to a depth (typically 3-3.5 microns) which exceeds the total thickness of the epitaxial layers. The resist is then removed. Nitride and/or oxide can be used in lieu of the aluminum for masking during the trench etch.

(s.2) After etching the trench with the ion mill, the layered substrate is cleaned and the trench and aluminum layer are coated with a thick layer of plasma nitride (typically 10,000-15,000 A). This nitride is ion milled at 75 degrees off axis to remove the nitride from the aluminum surface. This process yields only a partially planarized surface and the trench is only partially filled.

(s.3) Using repetitive process cycles in which depositions of nitride is followed by unpatterned layers of photoresist and reactive ion etching processes in which the etch rate for the photoresist and nitride are approximately equal, the trench is filled with nitride. The aluminum layer acts as an etch stop which prevents the underlying nitride from being etched during the RIE etch process. After two repetitions of this process the surface is essentially planar. After the planarization process the aluminum is stripped from the layered substrate. See FIG. 10 which shows a single trench 230.

(t) The layered substrate is then cleaned and 6000-8000 A of plasma oxide is deposited over the nitride. Photoresist is patterned and the first vias are etched down to the ohmic metal. From this point on a standard two-level metal process is used to complete the fabrication of the required circuits.

This concludes the description of the first preferred embodiment process. Doping levels and film thicknesses specified are typical and variations of the parameters in order to optimize the process for a specific application are included modifications.

Figure 11:
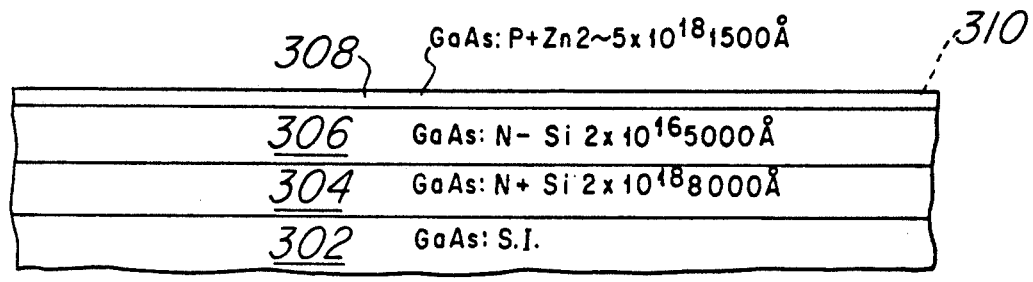
FIGS. 11-21 are cross sectional elevation views of the steps of a second preferred embodiment method.
Figure 12:
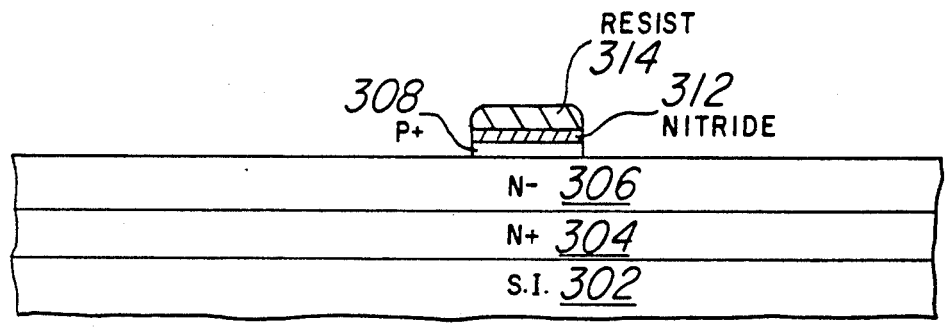
Figure 13:
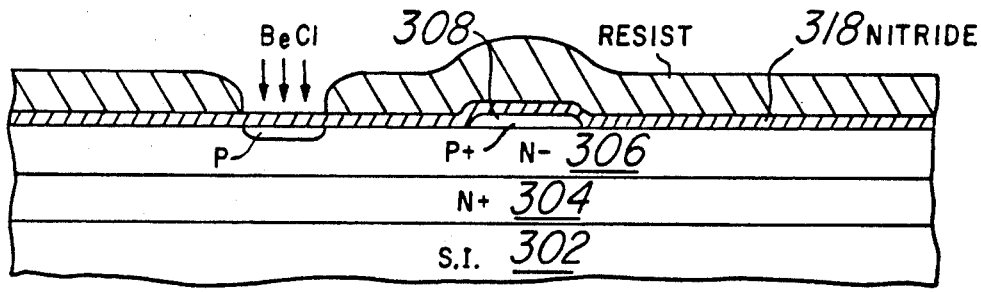
Figure 14:
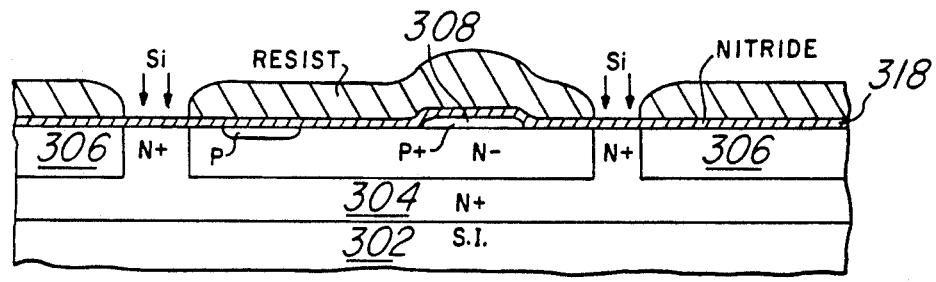
Figure 15:
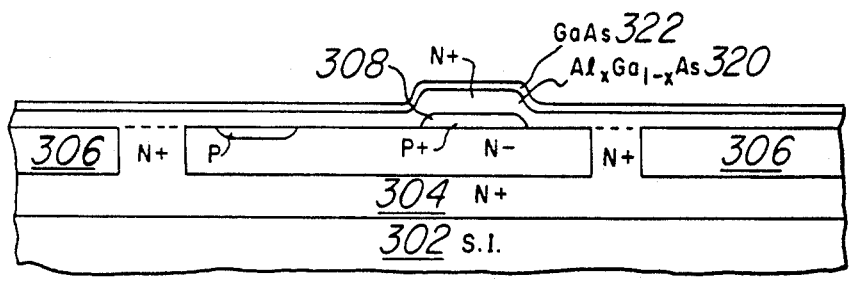
Figure 16:
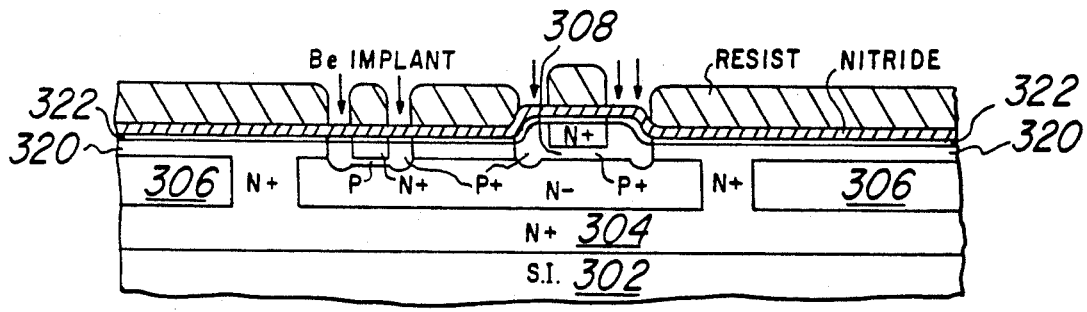
Figure 17:
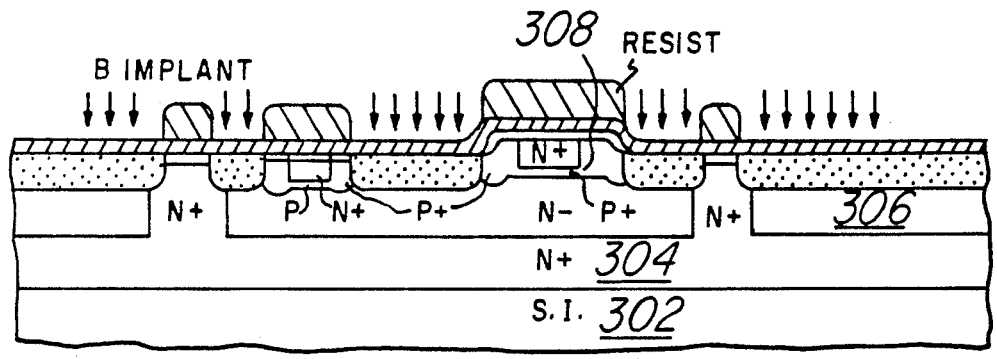
Figure 18:
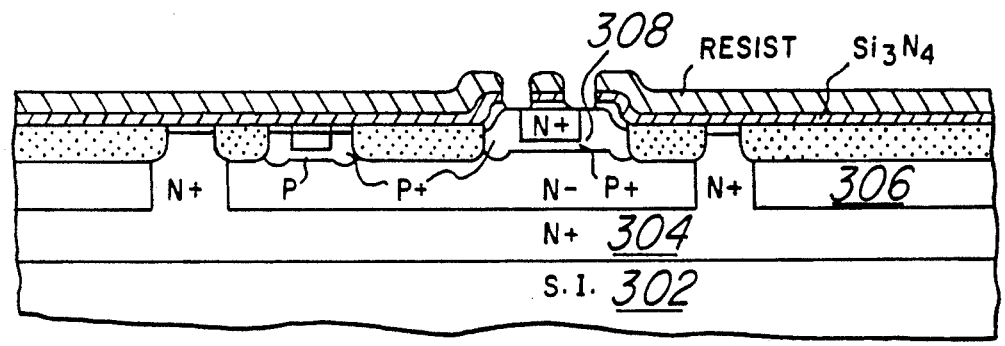
Figure 19:
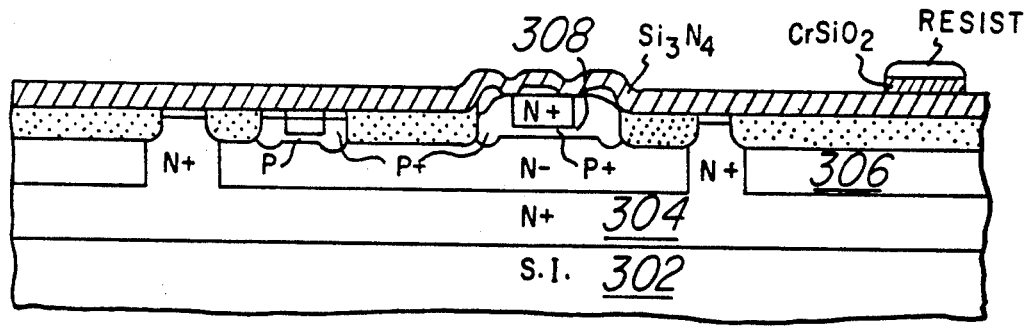
Figure 20:
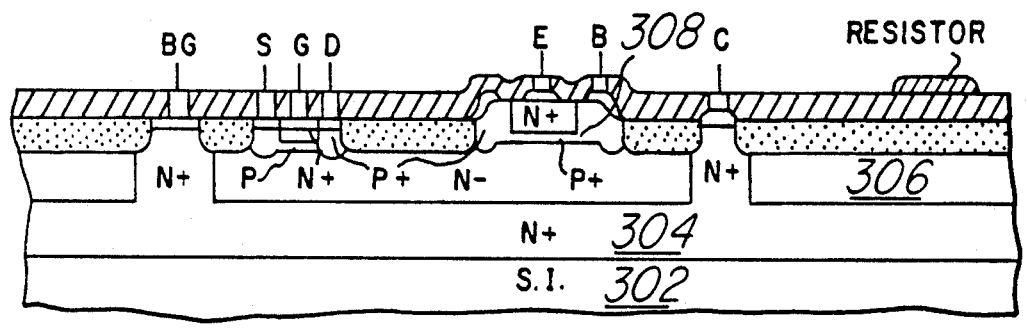
Figure 21:
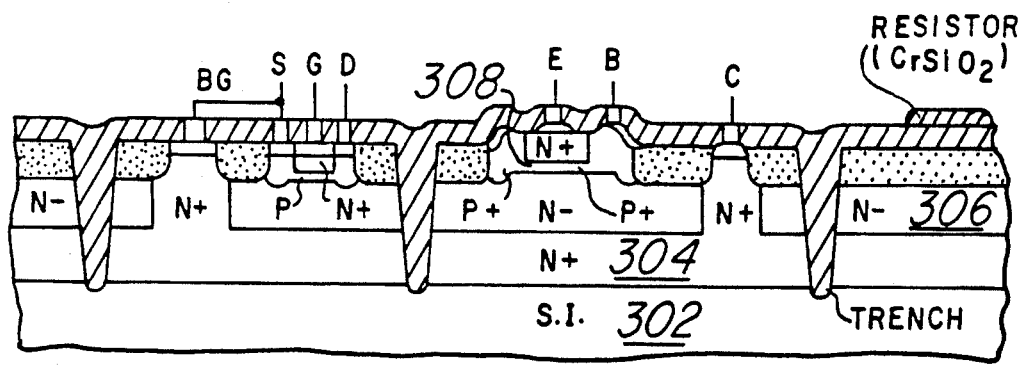

The second preferred embodiment method uses a grown base for the NPN transistor and includes the following steps as illustrated in cross sectional elevation view in FIGS. 11–21:

(a) Steps (a)-(c) of the first preferred embodiment describe the starting material and the formation of the NPN base by means of implantation of a P−type dopant. In lieu of this implantation process the starting material for the second preferred embodiment includes a top P−type doped GaAs layer as illustrated in FIG. 11 and has composition as follows:

| Layer | Thickness | Description/Function |
|---|---|---|
| 302 | 15-20 mils | Semi-Insulting GaAs Substrate |
| 304 | 10,000A | N+ GaAs layer doped to $2 \times 10^{18}/cm3$ silicon. This layer forms the low resistance buried collector for the NPN transistor as well as a low resistance connection to the P-channel JFET backgate. |
| 306 | 5,000A | N− GaAs layer doped with silicon from $5 \times 10^{15}/cm3$ to $5 \times 10^{17}/cm3$ depending on the device requirements. Lowering the N-epi doping decreases the collector-base capacitance, increases the collector-base breakdown while potentially increasing the collector resistance. Increasing the N-epi doping level tends to increase the maximum $f_t$ while reducing the collector resistance. The N-epi layer thickness can be any value greater than approx 1000A depending on the doping density and breakdown voltage requirements. |
| 308 | 1,000A | P-type GaAs layer doped with zinc, beryllium or other P-type dopants. The doping density of this region is grown at $5 \times 10^{17}/cm3$ to $2 \times 10^{19}/cm3$. This layer forms the base of the NPN transistor as well as the backgate for the N-channel JFET. Increasing the doping lowers the NPN transistor gain as well as the base resistance. This layer can also form the collector of the PNP transistor although optimum PNP performance would not be obtained. |
| 310 | 150A | Undoped GaAs layer to act as a buffer to minimize the affect of the P-type doping diffusing into the subsequently deposited AlGaAs emitter layer during the second epi deposition process. This layer is optional and could be doped n-type to insure that the base-emitter metallurgical junction does not occur at the interface between the original epi surface and the re-growth epi. Layer 310 is not shown in FIG. 11 for clarity. |

(b) The layered substrate is then coated with 400 A thick nitride layer 312, patterned with a photoresist mask 314 which covers the regions including the NPN transistor bases and N−channel JFET's as well as the alignment marks. The exposed nitride 312 is then etched away using a plasma process (such as CF4/O2) from the remaining areas, exposing the P−type GaAs 308 surface. Using a GaAs wet etch such as (1:8:160) the P−type GaAs regions are etched from the exposed surfaces. As an alternative to the wet etching of the P−type GaAs regions, a plasma etch such as CCl2F2 can be used. This etch depth is not critical and some overetching into the N−type layers is performed to insure that all of the exposed P−type layers are removed and that the remaining exposed GaAs surface is composed of only N−type GaAs 306. This etch provides permanent alignment marks for subsequently aligning the remaining photoresist levels. The remaining P−type epi regions form the backgate for the N−channel JFET's and the base regions for the NPN transistors and could possibly be used for the collector region of a PNP transistor. See FIG. 12 which only shows the NPN base 308.

(c) Photoresist 314 and remaining nitride 312 are stripped followed by a wet clean-up and thin nitride 318 deposition. Afterwards the first preferred embodiment method is followed starting with step (d) as illustrated in FIGS. 13-21 although only an NPN HBT and a P−channel JFET are shown so only an N−type $Al_xGa_{1-x}As$ epilayer 320 and N−type GaAs cap layer 322 are grown. The PNP and N−channel JFET as prescribed in the first embodiment can be added if desired.

Figure 22:
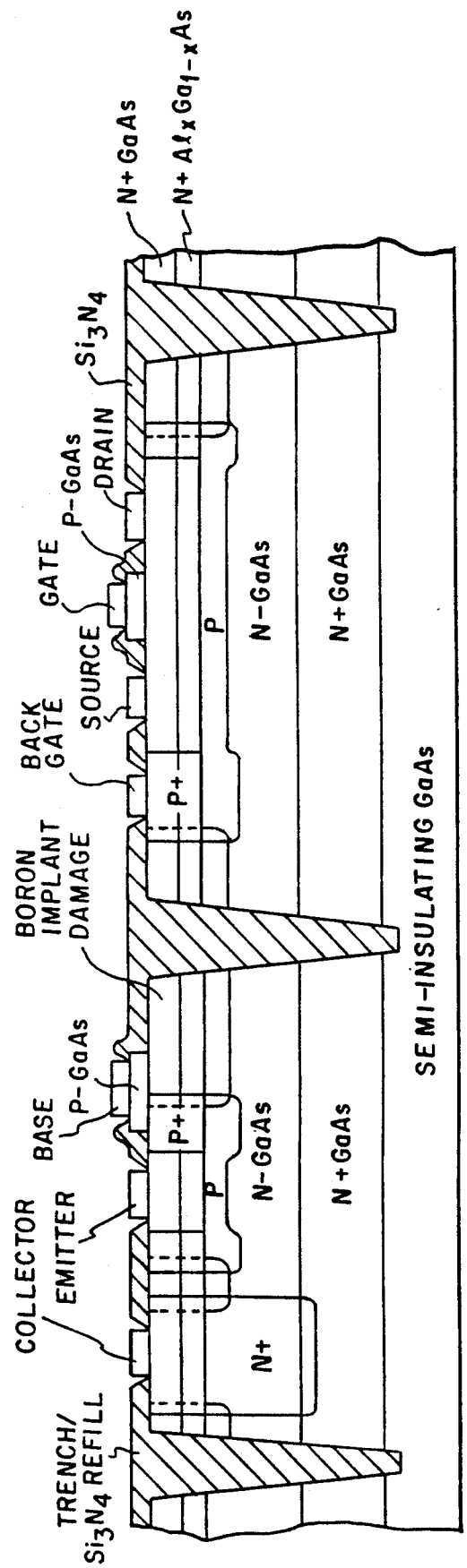
FIG. 22 is a cross sectional elevation view of an NPN HBT and an N-channel JFET fabricated by the method of the first embodiment.
Figure 23:
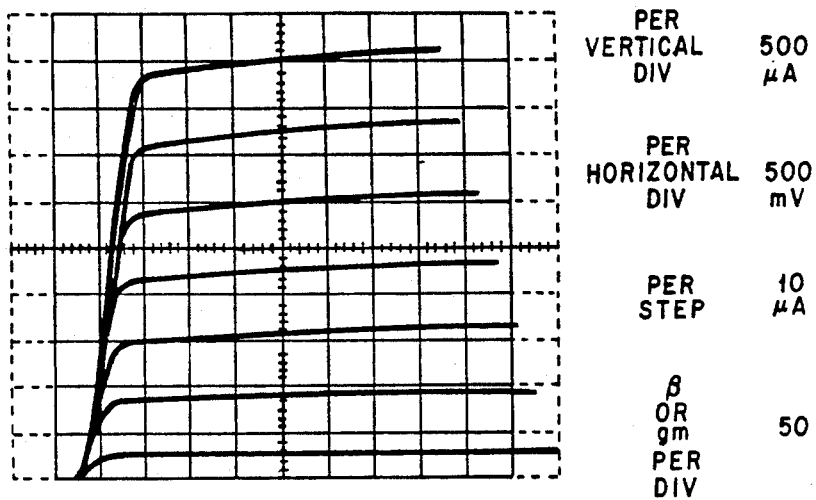
FIGS. 23 and 24 show current-voltage characteristics of the embodiment of FIG. 22.
Figure 24:
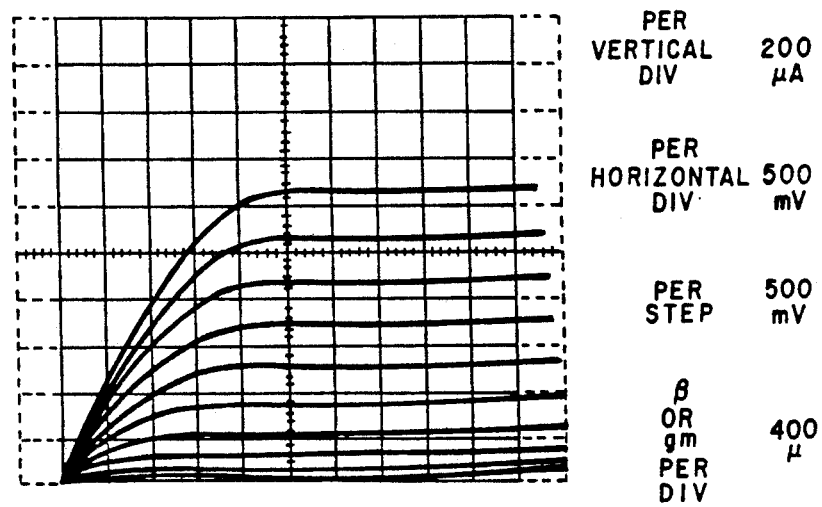

FIG. 22 shows in cross sectional elevation view an NPN HBT and an N−channel JFET fabricated by the first preferred embodiment method, and FIGS. 23-24 show the current-voltage characteristics of the devices of FIG. 22.

Figure 25:
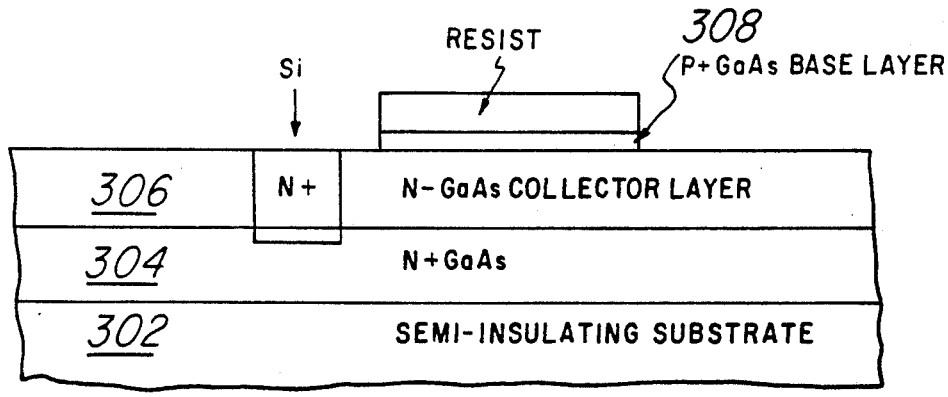
FIGS. 25-28 are further illustrations of steps in the second preferred embodiment method.
Figure 26:
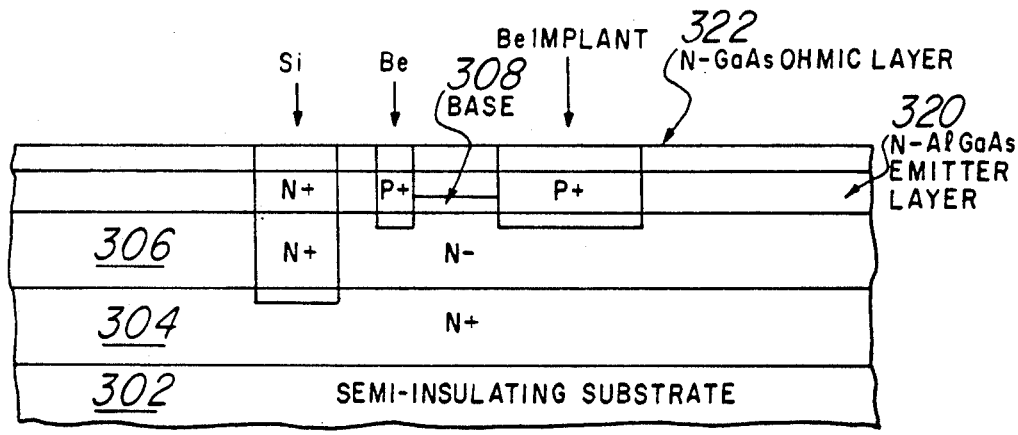
Figure 27:
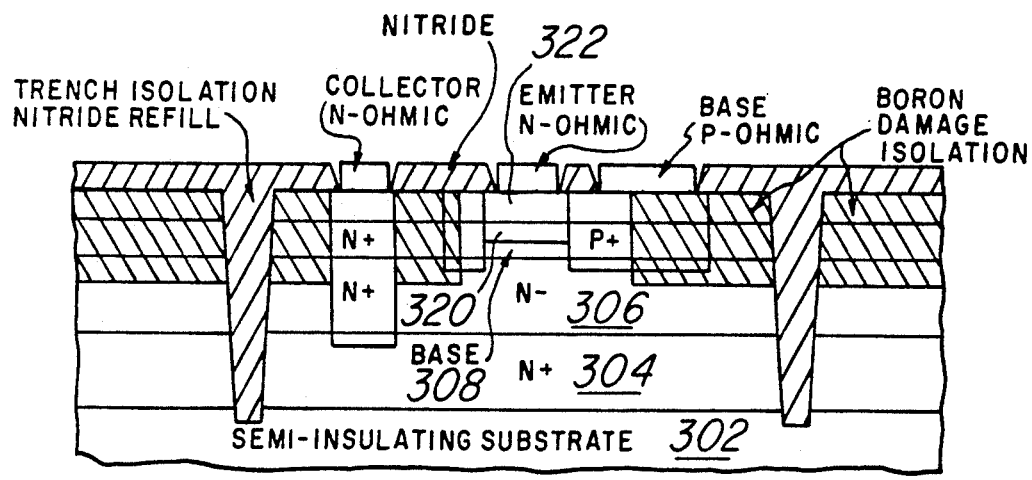
Figure 28:
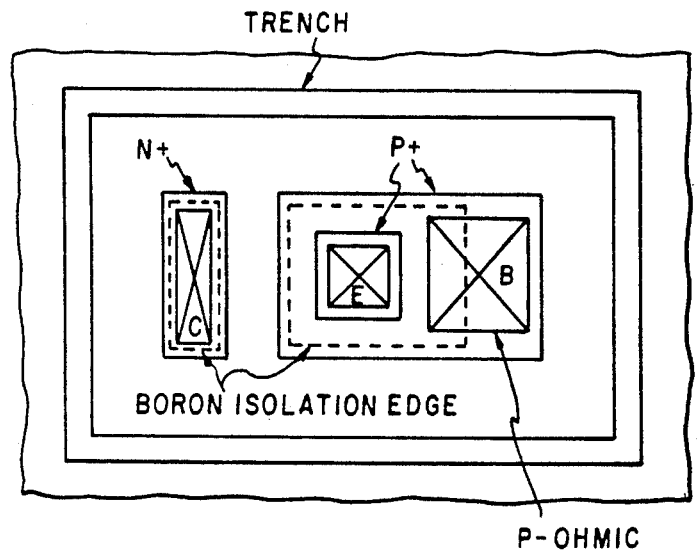

FIGS. 25-27 are further cross sectional elevation views of the second preferred embodiment method steps for fabrication an NPN HBT with FIG. 28 a plan view.

A third preferred embodiment method provides a PNP transistor for applications in which very low collector resistance is needed for the PNP transistors which are to be integrated with NPN transistors, and includes an additional epi deposition. This option may be attractive in cases in which a high energy P−type dopant implant process is not available for forming the PNP collector regions as in the first and second preferred embodiment methods. The method includes the following steps:

(a) The starting material is composed of a semi-insulating substrate with a N+ GaAs epi layer. The thickness of the epi layer would be determined by the required NPN collector sheet resistance. Regions in which the PNP transistors are to be fabricated would be patterned with photoresist, and the N+ GaAs region could be selectively etched from these regions although it is not necessary since the following implant will be able to overcompensate the N+ impurities and leaves the surface planar.

(b) Using this same resist pattern or a second pattern nested inside the etched regions, a P−type impurity such as beryllium, magnesium, zinc, etc. would be implanted into the GaAs. This implant would be activated during the subsequent epi deposition converting these regions into heavily doped P−type GaAs.

(c) After stripping the photoresist and any dielectric layer which may have been used to protect the surface during implant, a second epi deposition is carried out. This second epi deposition will include an N−epi region similar to that of layer 306 of the second preferred method plus, depending on whether a grown NPN base as the second preferred method or an implanted NPN base process as in the first preferred embodiment method is used, a P−type base layer similar to that of layer 308 may be deposited.

The process then proceeds as outlined in steps (d)-(t) of the first preferred embodiment or steps (b)-(c) of the second preferred embodiment. The PNP collector implant as outlined in step (f) of the first preferred embodiment method will be modified to account for the P+ buried layer. The third preferred embodiment would require a total of three epi depositions: one as part of the starting material; one for depositing the NPN N− collector region; and the one for depositing the emitter layers.

A fourth preferred embodiment method has selectively implanted NPN and PNP collector regions, and the starting material would be semi-insulating GaAs. Both the NPN N+ collector regions and/or PNP P+ collector regions are selectively implanted prior to growing the first epi layers. For this method the individual NPN transistor collector regions are not initially connected together through a grown N+ layer as is the case for the first preferred embodiment method. This simplifies the isolation process which would consist of a damage implant outside of the regions in which the active transistors are to be fabricated. By eliminating the continuous N+ layer described in the first preferred embodiment method, the capacitance of the various electrodes will be reduced since they would now reside over semi-insulating GaAs which behaves as a dielectric. The fourth preferred embodiment method includes the following steps (with only the NPN illustrated for clarity although the other three device types can be included as previously described):

(a) The starting material is semi-insulating GaAs substrate 402. After cleaning the substrate a thin layer of silicon nitride 404 or other dielectric material is deposited onto the surface. The substrate is then patterned with photoresist and the nitride layer is selectively removed from regions in which the alignment marks are to be formed. The photoresist mask is then removed.

Figure 29:
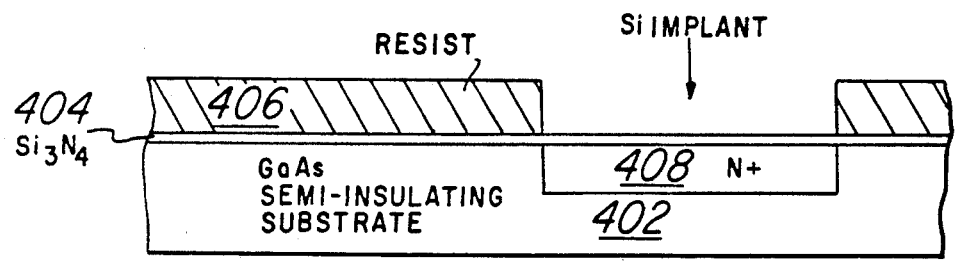
FIGS. 29-36 illustrate the steps of a fourth preferred embodiment method.
Figure 30:
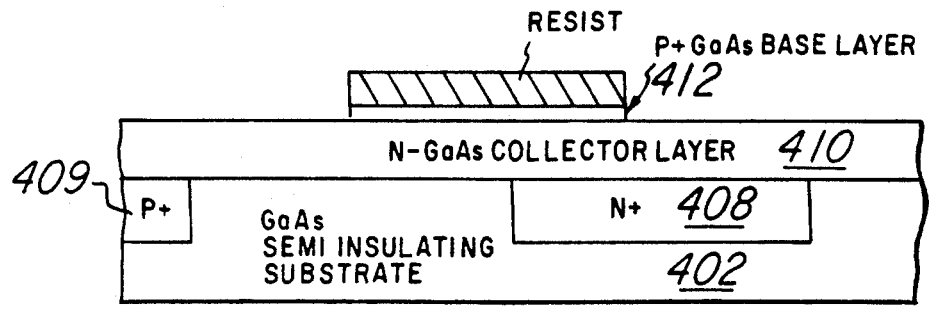
Figure 31:
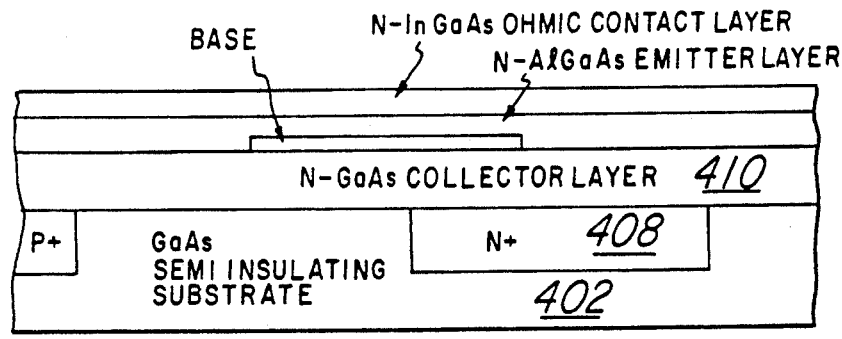
Figure 32:
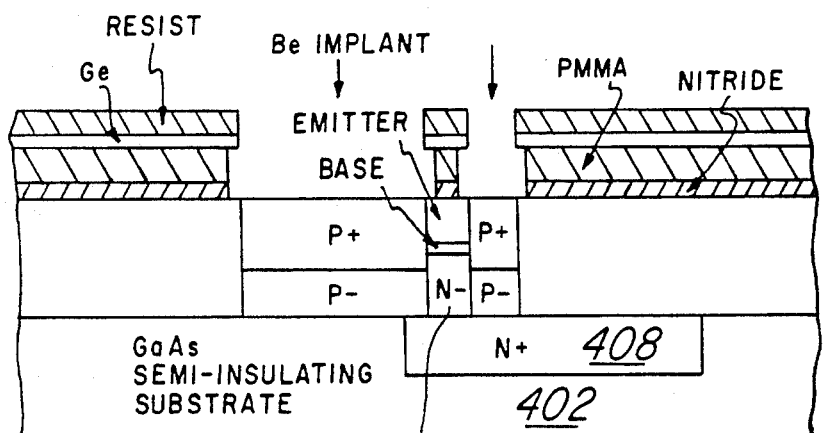
Figure 33:
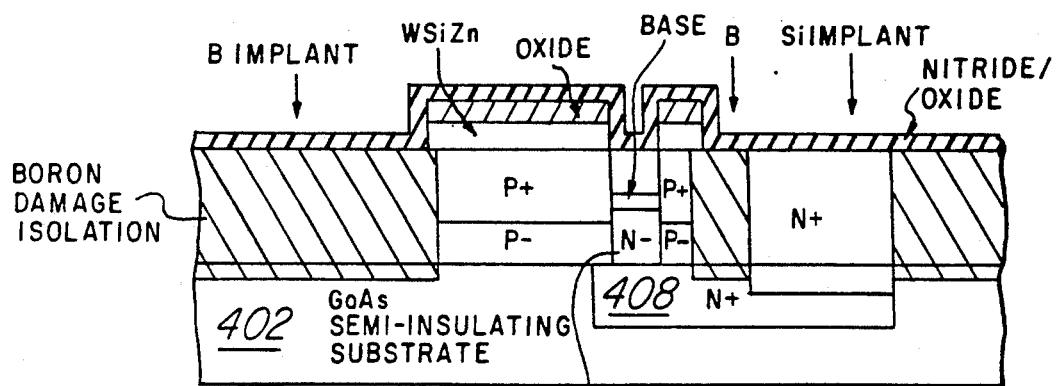
Figure 34:
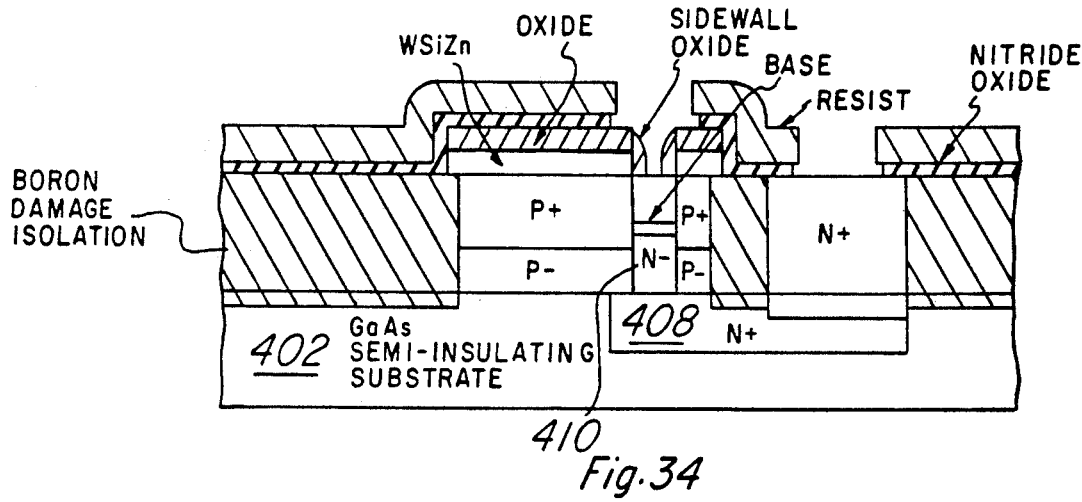
Figure 35:
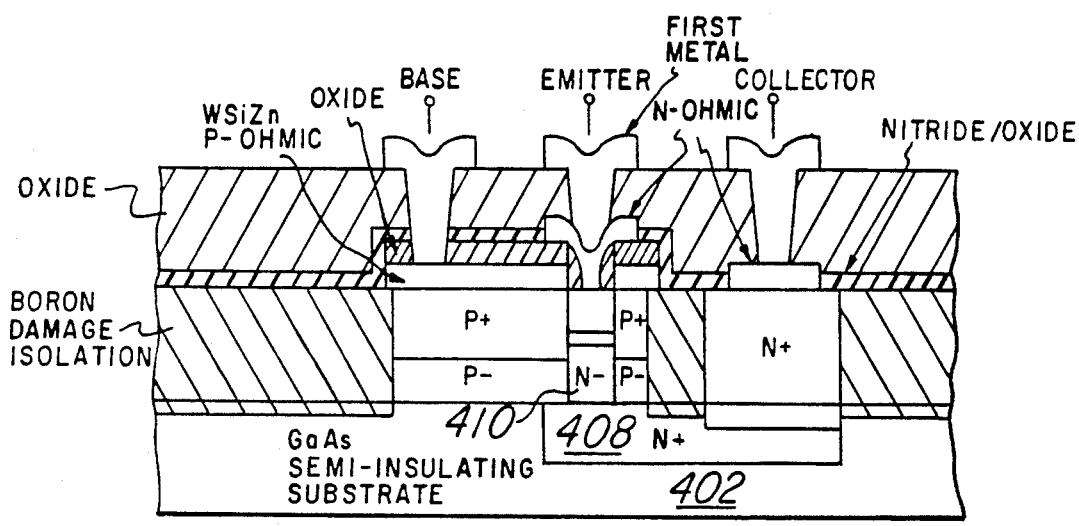

(b) Substrate 402 is then patterned with photoresist 406 and implanted with a N−type dopant such as silicon in the regions 408 which will form the NPN collectors and in regions to be used as diffused tunnels for simplifying the metal interconnect as well as regions in which N−type GaAs resistors are to be formed. The energy of the N−type dopant and the thickness of the nitride layer specified in step (a) are adjusted to give the desired N+ collector doping profile. See FIG. 29.

(c) With the NPN collector implant mask still in place, the substrate is then subjected to a GaAs etch (such as 1:8:160 H2SO4:H2O2:H2O or CH4/H2 plasma process) to define the alignment marks in the GaAs. The only areas which are etched are those in which a pattern exists in the NPN collector level which is nested inside the holes previously etched in the nitride level (see step (a) above). These patterns etched in the GaAs provide permanent alignment marks allowing subsequent levels to be aligned to the NPN collector. These alignment marks could be incorporated in other levels such as the PNP collector with appropriate process changes to make it possible to align critical geometries to the most critical level. After etching the alignment marks the photoresist is stripped; the alignment marks are not illustrated.

(d) The substrate is then patterned and implanted with a P−type impurity such as beryllium, magnesium, zinc, etc., to form the PNP P+ collector regions 409 similar to the process described in the third preferred embodiment method. This implant could be activated during the subsequent epi deposition converting these regions into heavily doped P−type GaAs.

(e) After stripping the photoresist plus dielectric layer 404 which may have been used to protect the surface during implant, the second epi deposition is carried out. This second epi deposition will include an N− epi region 410 similar to layer 306 in the second preferred embodiment plus, depending on whether an implanted NPN base process as described in the first preferred embodiment method or a grown NPN base as in the second preferred embodiment method is used, a P−type base layer 412 similiar to layer 308 of the second preferred embodiment method may be deposited.

Figure 36:
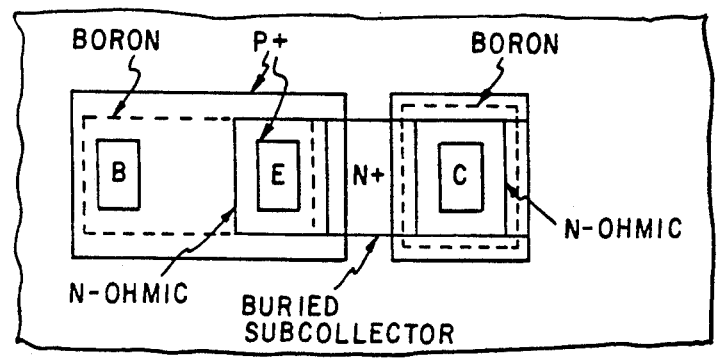
Figure 37:
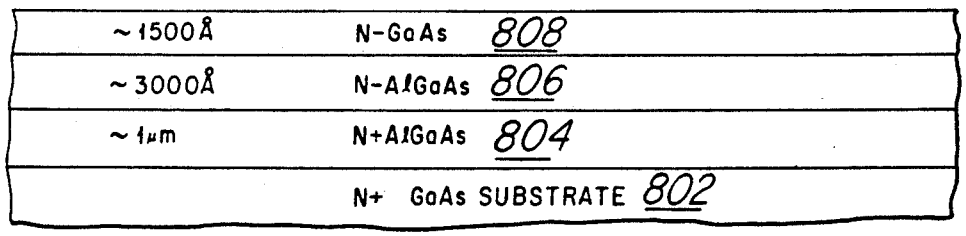

The process then proceeds essentially as outlined in the first preferred embodiment method starting with step (b). See FIGS. 30-35 which show the fabrication of an NPN HBT in cross sectional elevation view, and FIG. 36 which is a plan view. The trench isolation can be omitted for process simplification. The PNP collector implant as outlined in step (f) will be modified to account for the P+ buried layer 409. The fourth preferred embodiment would require a total of two epi depositions: one for depositing the NPN N− collector region; and one for depositing the emitter layers.

The fifth preferred embodiment method makes use of mesa structures with selectively defined buried N+ and P+ doped layers. The first, second, and fourth preferred embodiment methods require two epi depositions. The first epi layer is deposited after the formation of the heavily doped collector regions. The second epi layer is deposited after the formation of the base by either implanting as described in the first preferred embodiment method or selectively etched as outlined in the second preferred embodiment method. In an effort to reduce the number of epi deposition steps the fifth preferred embodiment method offers a process in which only one epi deposition is required as follows:

(a) Buried NPN and PNP heavily doped collector regions are selectively formed in semi-insulating GaAs as in the fourth preferred embodiment method. This is followed by an epi deposition which includes the NPN N−collector layer, the NPN P−type doped base layer, N−type AlGaAs, N−type GaAs, P−type AlGaAs and finally a P−type GaAs layer as outlined in the following table:

| Layer | Thickness | Description/Function |
|---|---|---|
| 1 | 5000A | N− GaAs layer doped with silicon to mid-10$^{15}$ to mid-10$^{17}$ depending on the device requirements. Lowering the N-epi doping decreases the collector-base capacitance, increases the collector-base breakdown while potentially increasing the collector resistance. Increasing the N-epi doping level tends to increase the maximum $f_t$ while reducing the collector resistance. The N-epi layer thickness can be any value greater than approx 1000A depending on the doping density and breakdown voltage requirements. |
| 2 | 1000A | P-type GaAs layer doped with zinc, beryllium or other P-type dopants. The doping density of this region is grown at mid-10$^{17}$ to 2 × 10$^{19}$ per cm3. This layer forms the base of the NPN transistor as well as the backgate for the N-channel JFET. Increasing the doping lowers the NPN transistor gain as well as the base resistance. This layer can also form the collector of the PNP transistor although optimum PNP performance would not be obtained. |
| 3 | 150A | Undoped GaAs layer to act as a buffer to minimize the affect of the P-type doping diffusing into the subsequently deposited AlGaAs emitter layer during the second epi deposition process. This layer could be doped N-type to insure that the base-emitter metallurgical junction does not occur at the interface between the original epi surface and the re-growth epi. |
| 4 | 300 | Graded AlGaAs region in which the aluminum composition is varied from zero to 30% and the silicon doping is held constant at 2 × 10$^{17}$/cm3. The function is to smooth the bandgap transition between GaAs and AlGaAs |
| 5 | 1000A | N-type AlGaAs layer with 30% aluminum doped with silicon to 2 × 10$^{17}$/cm3. This layer forms the emitter for the NPN HBT and is part of the channel for the N-Channel JFET and forms the gate for the P-channel JFET. |
| 6 | 1000A | N-type GaAs layer doped with silicon to 2 × 10$^{17}$/cm3. This layer is used to make ohmic contact to the NPN Emitter and Collector as well as forms the conducting channel for the N-Channel JFET and the base for the PNP. The thickness and doping of this layer can be adjusted to |

-continued

| Layer | Thickness | Description/Function |
|---|---|---|
| | | optimize the PNP or N-channel JFET performance. |
| 7 | 300A | graded P-type AlGaAs with aluminum concentration varied between zero at the previous N—GaAs surface to 30% while the P-type dopant (typically zinc) concentration is held constant at $2 \times 10^{17}/cm3$. Function is to smooth the bandgap transition between GaAs and AlGaAs. |
| 8 | 1000A | P-type AlGaAs layer with 30% aluminum concentration doped with $2 \times 10^{17}/cm3$ zinc. This layer forms the emitter of the PNP transistor as well as the top gate for the N-channel JFET. |
| 9 | 300A | Graded P-type AlGaAs layer in which the aluminum concentration is varied from 30% to zero as the layer is grown. The P-type doping is held constant at $2 \times 10^{17}/cm3$. The function is to smooth the bandgap transition between AlGaAs and GaAs |
| 10 | 1000A | P-type GaAs doped with $2 \times 10^{18}/cm3$ zinc. This layer is used to make ohmic contact to the PNP emitter and collector, the gate of the N-Channel JFET and base of the NPN. |

Thin buffer regions in which the aluminum concentration is graded between that used in the AlGaAs and zero can be used between the various transistions from GaAs to AlGaAs and back. If PNP transistors are not to be fabricated, the P—type AlGaAs layer could be omitted and if no N-JFETs or PNPs are required the P—type GaAs layer would also be omitted.

(b) After depositing the epi layers the process continues as outlined in steps (j)–(l) in the first preferred embodiment method.

(c) To access the NPN collector regions from the top surface, the wafers are patterned and the nitride is plasma etched from the desired areas over the buried NPN collectors. The GaAs/AlGaAs layers are etched down to the N— NPN collector layer. This etch results in a mesa structure in which the NPN base and emitter contacts are on the top level while the NPN collector contact is made at a lower level. This same photoresist mask can be used as mask for implanting silicon to form a N+ plug down to the buried NPN collector in the contact region. The nitride is then stripped from the wafers and a new plasma nitride layer is deposited with a typical thickness of 400 A.

(d) The process then continues as outlined in steps (m) through (r) in the first preferred embodiment method. No trench process as described in steps (s)–(s.3) is required, which significantly simplifies the process. The wafers are then processed through the interconnect levels as described briefly in step (t) which completes the process.

The sixth preferred embodiment method uses an AlGaAs layer as a sacrificial layer for controlling the NPN base profile and as a cap layer for the implanted base anneal. In lieu of the use of a nitride layer as the sacrificial layer to determine the location of the base implant profile as in steps (b) and (c) of the first preferred embodiment method, an additional layer of $Al_xGa_{1-x}As$ could be deposited during the initial epi growth step. The thickness of this $Al_xGa_{1-x}As$ layer would be adjusted along with the implant dose and energy to yield the desired doping profile for the NPN base. The Al concentration would be set at x=0.5 to allow this later to be selectively removed in hot HF without the removal of the underlying GaAs layers. The $Al_xGa_{1-x}As$ layer would also act as the cap layer for the implant anneal. This approach has the advantage over the use of nitride in that the thermal properties of $Al_xGa_{1-x}As$ better match that of GaAs than those of nitride and should produce less strain. Additionally, the $Al_xGa_{1-x}As$ would maintain an arsenic rich surface in contact with the base layer during the initial processing. This is especially true if annealing is done outside an arsenic rich environment.

The seventh preferred embodiment has the NPN N— and/or N+ collector layers in the first epi made with AlGaAs so that the NPN is a double heterojunction device.

The eighth preferred embodiment is an NPN emitter down structure on N+ GaAs substrate. On the N+ GaAs substrate, the NPNs are common emitter coupled and HI²L technology can be used, which enables dense transistor packing. Additionally, the inclusion of both NJFET, PJFET, and PNP devices adds a powerful new dimension to the circuit possibilities. The processing is shown in FIGS. 37 to 48, where the substrate illustrated is N+ GaAs, and includes the following steps:

(a) The starting epi structure on N+ GaAs substrate 802 is N+ AlGaAs layer 804, ~1 μm thick and highly doped, $\sim 2 \times 10^{18}$ cm$^{-3}$, to minimize emitter resistance. The next epi layer 806 is the active emitter, N— AlGaAs, which is usually doped $\sim 2 \times 10^{17}$ cm$^{-3}$ to minimize the emitter-base capacitance, with a thickness of ~3000 Å. The final starting epi layer 808 is N— GaAs of $\sim 5 \times 10^{16}$ cm$^{-3}$ and ~1500 Å thick; see FIG. 37. The NPN base, NJFET backgate, PJFET channel, and the PNP base will be formed in layer 808, so its thickness and doping should be adjusted to optimize the desired devices. Additionally, layer 808 is important because overgrowth onto a GaAs layer is easier then onto AlGaAs where the problem is $Al_2O_3$ covering the surface tends to inhibit single crystal growth. Note that the N—channel and P—channel JFETs are formed in essentially the same manner as in the first seven preferred embodiments.

Figure 38:
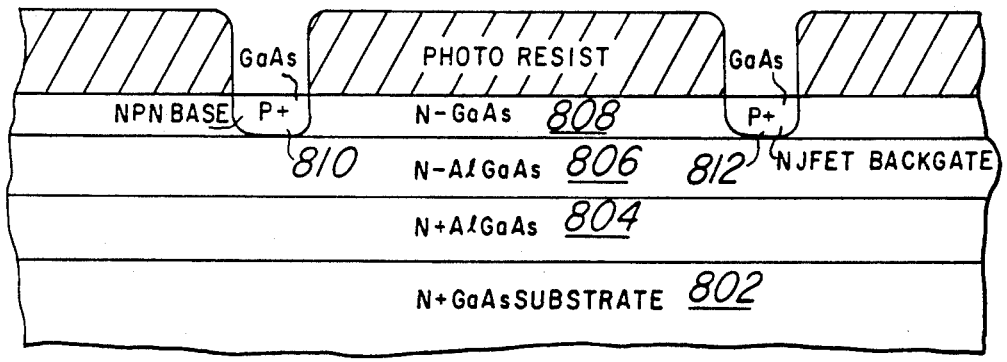

(b) The first P—type implant. FIG. 38, forms the base 810 of the NPN and the backgate 812 of the NJFET in the N— GaAs layer 808. A shallow implant such as BeCl, Zn, or Mg will give the correct profile. The implant may be preceded by a thin (400 A) nitride deposition. Beryllium can also be used as the P—type dopant, especially if it is implanted through enough nitride to just leave the tail of the implant in the epi layer.

Figure 39:
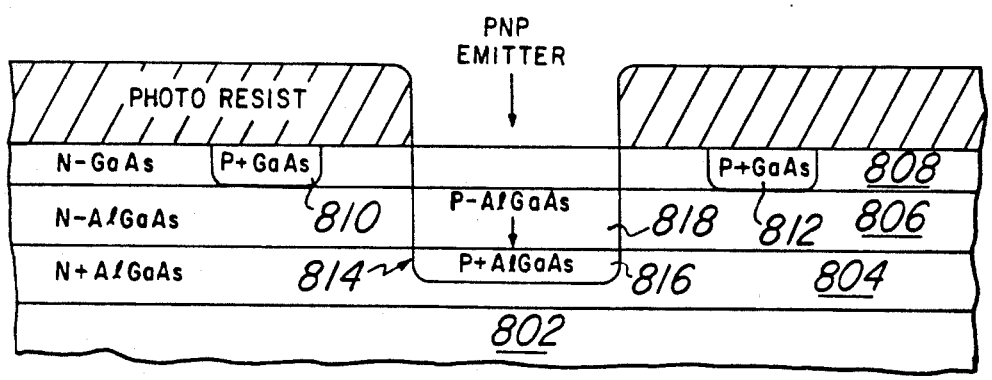

(c) Formation of the PNP emitter, FIG. 39, is done with multiple implants to obtain a graded P—type region 814. The implant doses and energies for the PNP emitter 814 are adjusted to yield a deep heavily doped, $\sim 5 \times 10^{18}$ cm$^{-3}$, region 816 to reduce the PNP emitter resistance and a shallow lighter doped $\sim 2-5 \times 10^{17}$ cm$^{-3}$, region 818 to minimize the emitter-base capacitance. The shallow P—type doping must be high enough to avoid compensation by the subsequent PNP base 820 implant. The minimum implant energy for the PNP emitter layer is adjusted to minimize the compensation of the top N— GaAs layer 808.

Figure 40:
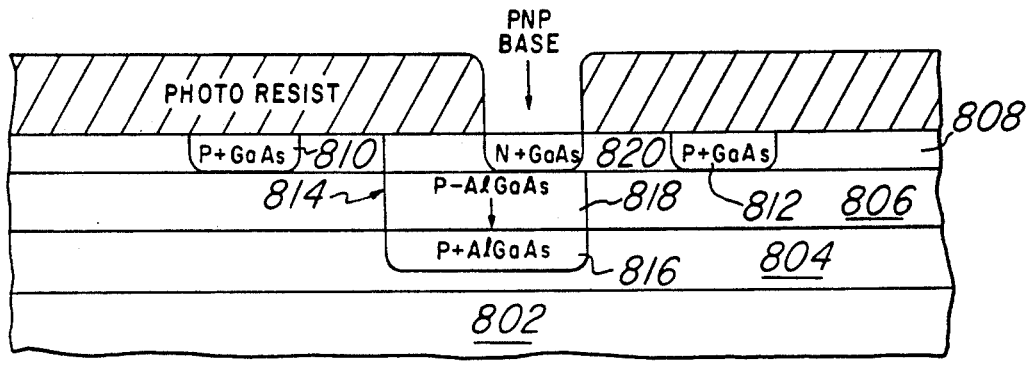

(d) The PNP base 820 is formed in N— GaAs layer 808, FIG. 40, by a shallow N—type dopant such as Si which activates well in the same temperature range as does Be, which is the dominate P—type implant. If the PJFETs were not necessary then N— GaAs layer 808 could be more highly doped $\sim 1 \times 10^{18}$ cm$^{-3}$ which would make this implant, FIG. 40, unnecessary. If N—

GaAs layer 808 were higher doped, the P+ GaAs implant for regions 810 and 812 would have to completely convert NPN layer 808. Most NPN base dopings of interest are $\geq 2 \times 10^{18}$ cm$^{-3}$ and Be activates very well so the conversion of N−type $\sim 1 \times 10^{18}$ cm$^{-3}$ to P−type is not difficult.

Figure 41:
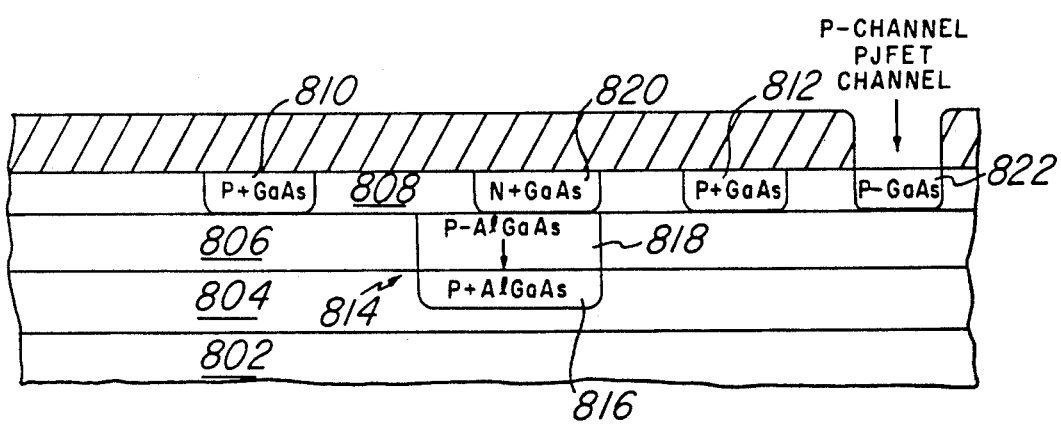

(e) The PJFET channel 822 is formed in N− GaAs layer 808, FIG. 41, by a shallow P−type implant, such as BeCl, at a doping density of $\sim 1 \times 10^{17}$ cm$^{-3}$.

(f) The overgrowth epi, FIG. 42, is a simple MOCVD epi consisting of a $\sim 4000$ A thick GaAs NPN collector layer 824 at $\sim 2\text{-}20 \times 10^{16}$ cm$^{-3}$ and a $\sim 2000$ Å thick ohmic N+ GaAs cap layer 826 at $\sim 2 \times 10^{18}$ cm$^{-3}$. The overgrowth requires an anneal, either prior to the epi or in-situ, where the surface must be maintained in good/clean condition to avoid putting recombination sites and defects at the NPN and PNP base/collector interface. The advantage this emitter down structure has versus the emitter up overgrowth structure is that for the emitter down HBT the overgrowth interface is at the base/collector junction which is less a critical junction then the base/emitter junction.

(g) The PNP collector 828 is made, FIG. 43, by multiple P−type implants giving a lightly doped P−region 830, $\sim 2 \times 10^{17}$ cm$^{-3}$, at the overgrowth interface (base/collector interface) and a heavily doped P−region 834 at the surface, $\sim 5 \times 10^{17}$ cm$^{-3}$.

Figure 44:
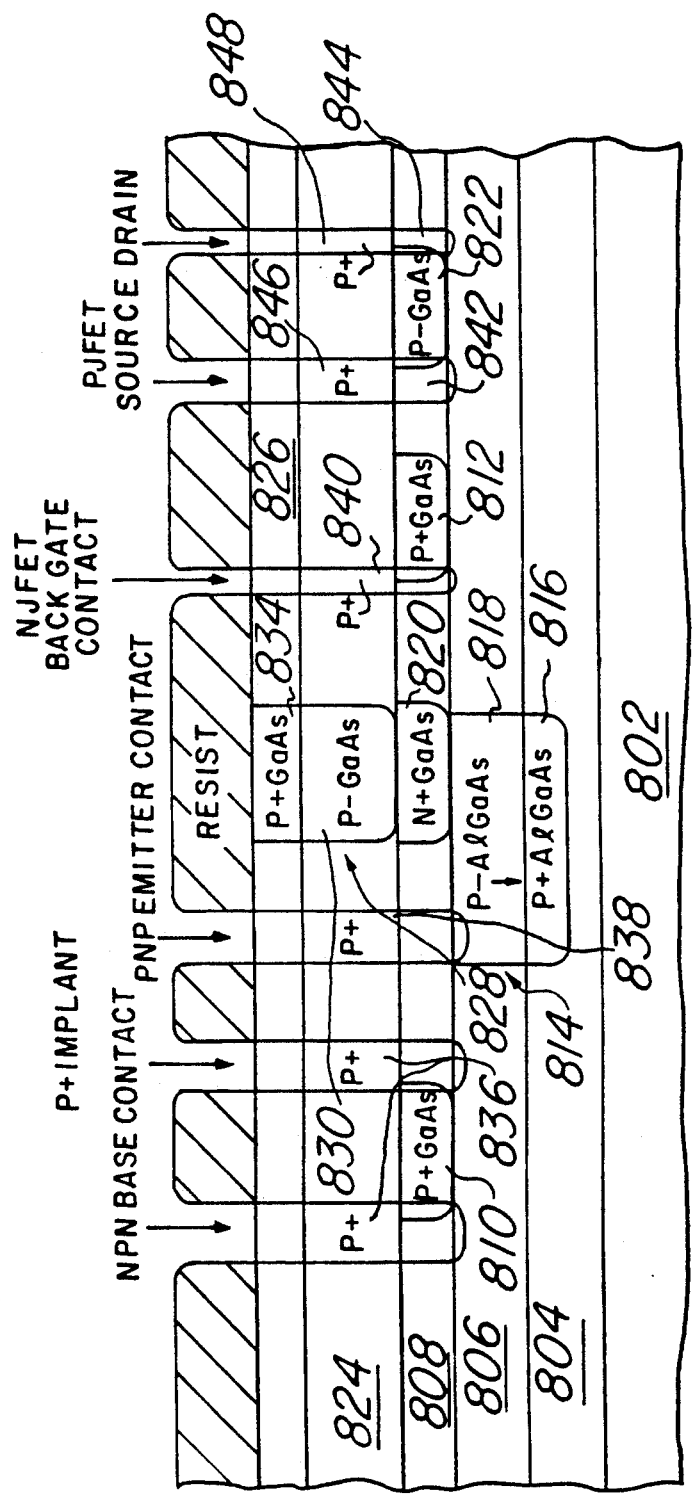

(h) The P+ implant, FIG. 44, connects up the NPN base 810 by region 836, the PNP emitter 814 by region 838, the NJFET backgate 812 by region 840, and the PJFET source 842 and drain 844 by regions 846 and 848 to the top surface.

Figure 45:
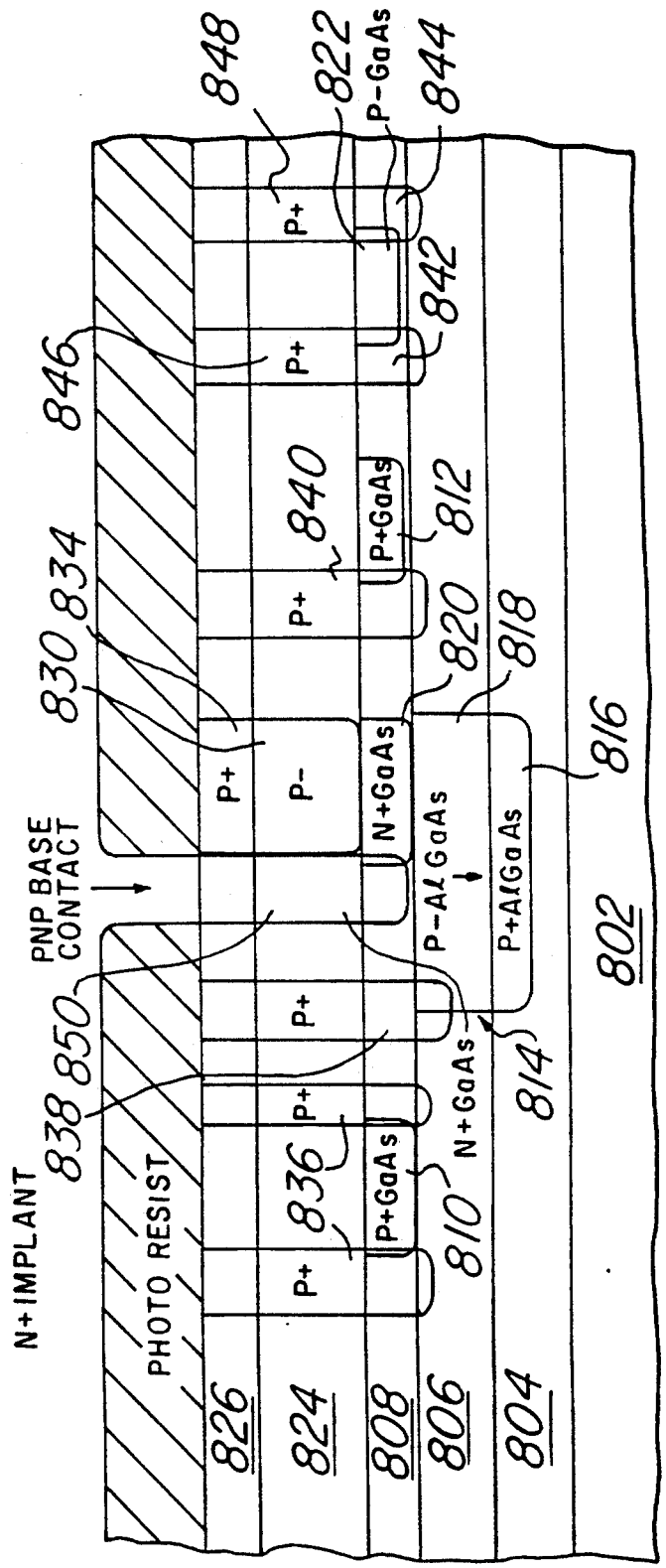

(i) The N+ implant, FIG. 45, reduces the resistance of the PNP base contact 850. Without this implant the base contact could still be made, however the conduction would be through N− GaAs rather than N+ GaAs. The N+ implant can be extended laterally to completely surround the PNP base region (similar to the P+ base connection for the NPN, FIG. 44) to further reduce the PNP base resistance and to better isolate the PNP emitter and collector regions.

Figure 46:
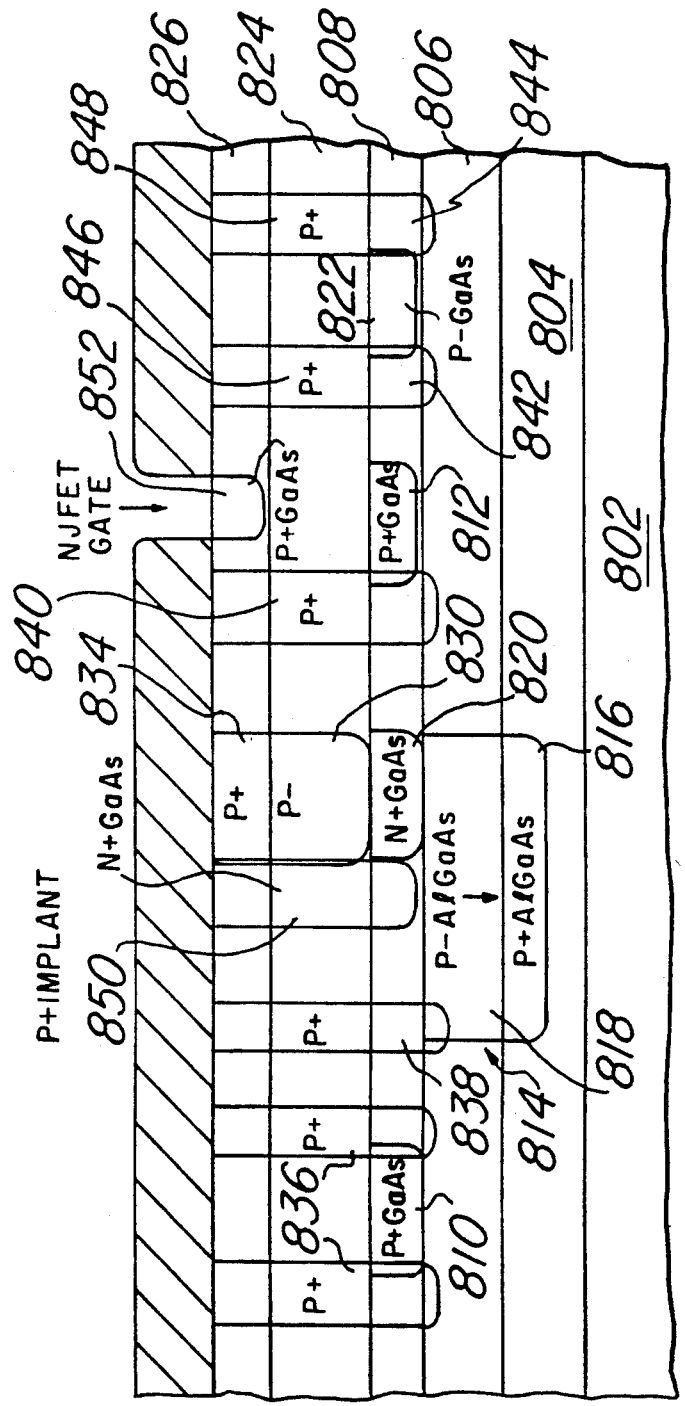

(j) The NJFET gate 852, FIG. 46, is made with a shallow P−type implant such as BeCl which converts the N+ ohmic cap layer 826 to P−type so that gate depletion with extends far enough into the NJFET channel. This could also be done with a P−type diffusion. The depth of the P implant is adjusted to yield the desired N−channel threshold voltage.

Figure 47:
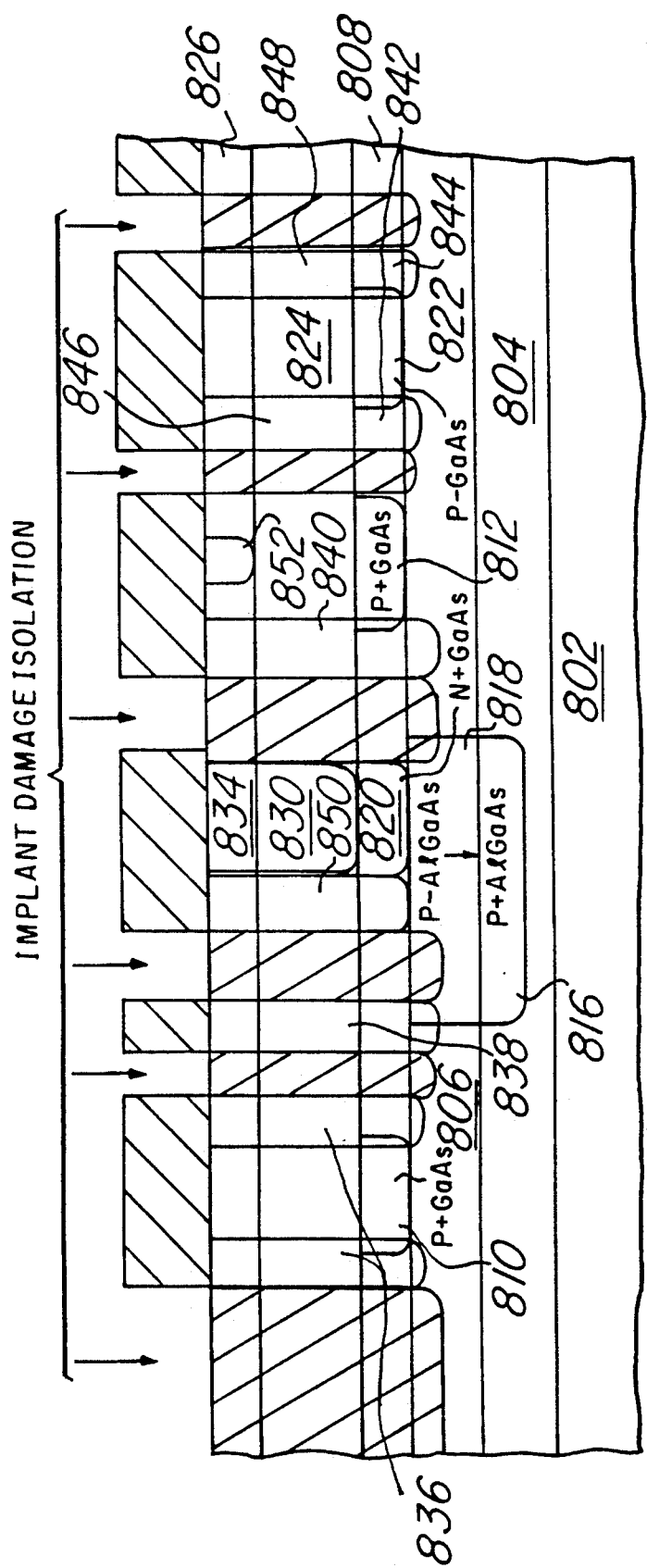

(k) Implant damage isolation, FIG. 47, separates devices from each other but also separates the PNP emitter contact 838 from the PNP base contact 850. The lateral dimensions of the implant damage pattern overlaps the various geometries sufficiently to account for alignment tolerances to insure good isolation.

Figure 48:
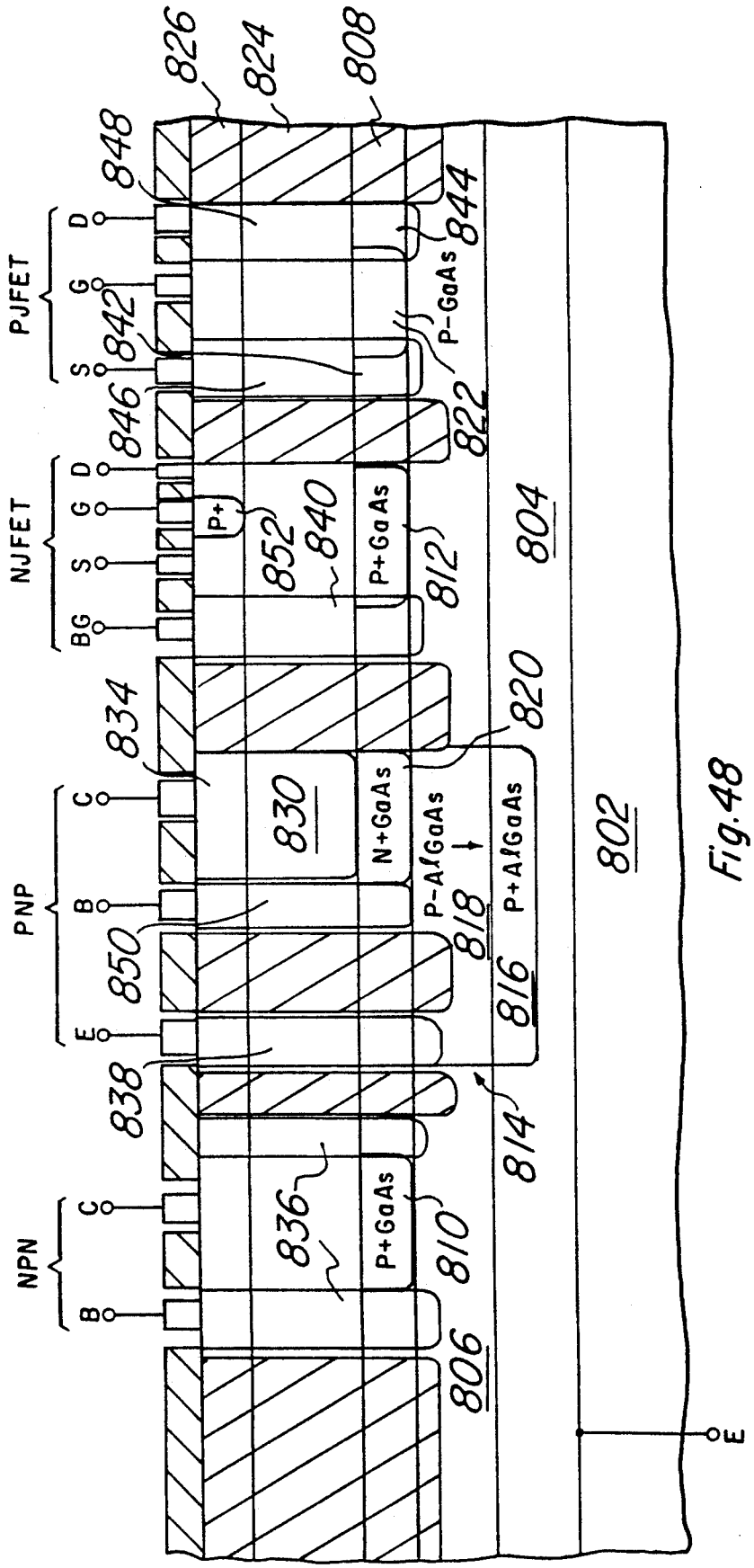

(l) The ohmic contacts are made, FIG. 48, by nitride assisted lift-off in a standard manner. The P−Ohmics are AuZn while the N−Ohmics are AuGeNi. The device contacts are on a planar surface so that subsequent metal interconnection is readily accomplished.

The ninth preferred embodiment is a modification of the eighth preferred embodiment, where the NPN is divided into two different types of transistors. The first type is a standard NPN with common emitter through the back side contact as used in HI²L. The other type NPN is an isolated emitter transistor, which is accomplished by inserting a P−layer between the NPN AlGaAs emitter layer and the N+ substrate and surrounding the NPN with trench isolation. The process is outlined in FIGS. 49-51 where only the integration of both NPNs with a PNP is shown. The NJFET and PJFET could also be integrated if desired as outlined in the previous embodiments.

The addition of isolated emitter NPN will solve many of the current HI²L technology I/O problems. Present HI²L voltage levels are incompatible with silicon integrated circuit I/O standards (ECL, TTL, CMOS, ...), because the HI²L emitters are all common making it difficult to get level shifts. With isolated emitter transistors it will be possible to make source followers, differential I/O, and have robust and bi-directional I/O.

The integration of NPNs and PNPs will enable complementary linear and digital applications. PNPs are desired for high speed/low power Op-Amps. PNPs can be used as current sources and in complementary pairs with NPNs which greatly expands the circuit potential.

Figure 49:
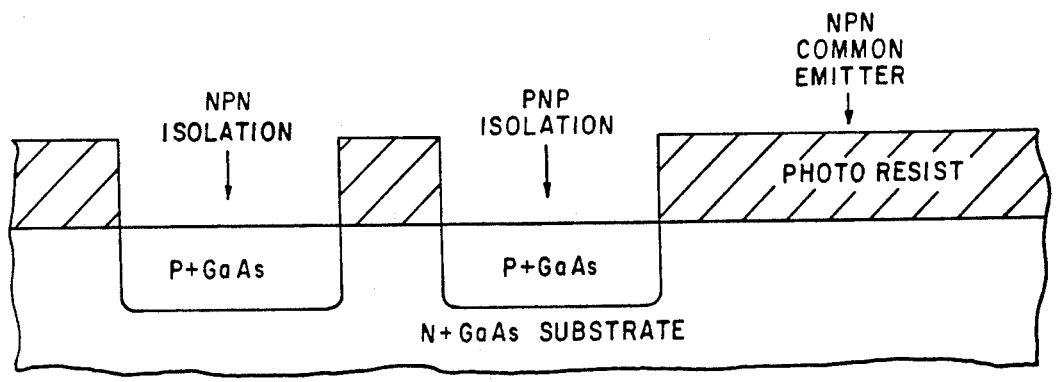
FIGS. 49-51 illustrate the steps of a ninth preferred embodiment method.

The ninth preferred embodiment includes the following steps:

(a) The starting N+ GaAs substrate, FIG. 49, is processed prior to any epi deposition. The P+ implant provides emitter isolation for the NPN and lower the emitter resistance for the PNP. The exact doping/width of the P+ isolation implant is non critical, just that the leakage current is blocked. Trade-off analysis between the isolated emitter parasitic capacitance, breakdown voltages and the performance of the parasitic NPN transistor formed with the substrate will be used to determine the P+ doping profile for various applications.

Figure 50:
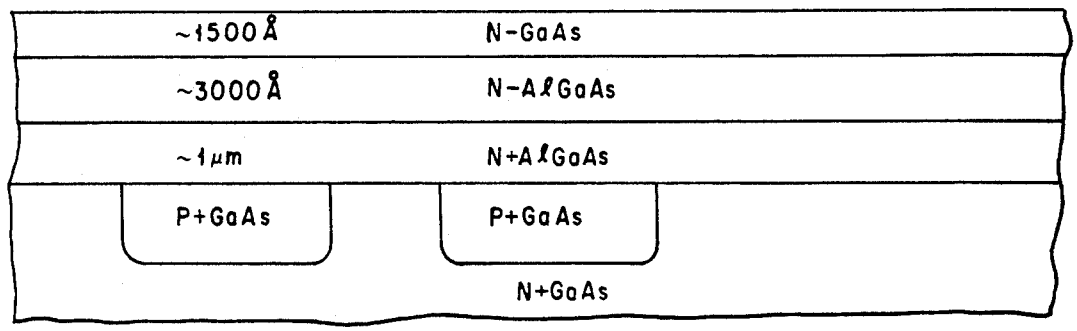

(b) The first epi is deposited, FIG. 50, onto the P+ isolation tanks. The overgrowth requires an anneal, either prior to the epi or in-situ, where the surface must be maintained in good/clean condition to obtain good surface morphology and minimize defects. This epi is the same as the starting epi in the eighth preferred embodiment, FIG. 37. The necessary processing steps to integrate the NPN and PNP are then the same as shown in FIGS. 38-40, 42-45, and 47-48.

Figure 51:
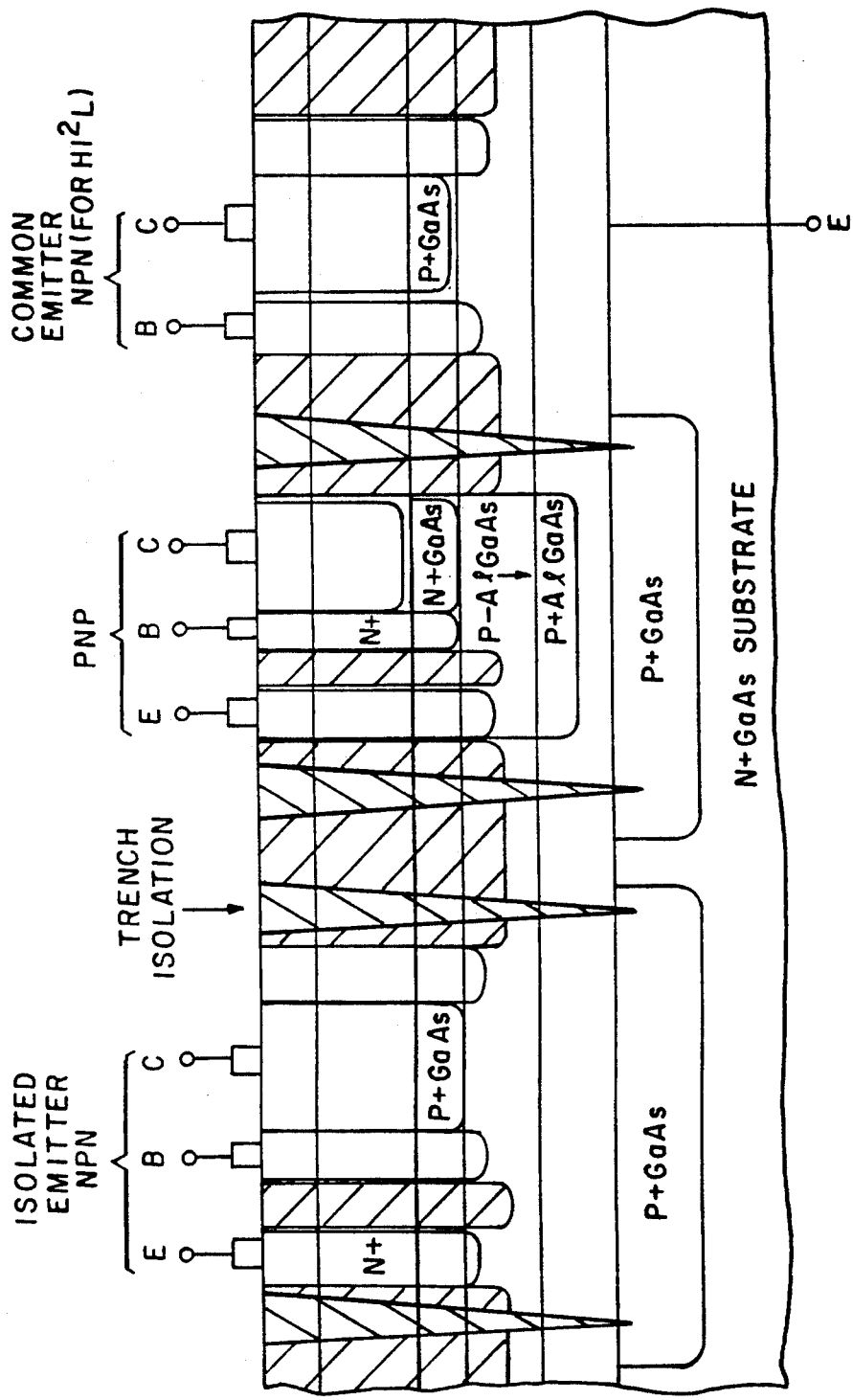
Figure 52:
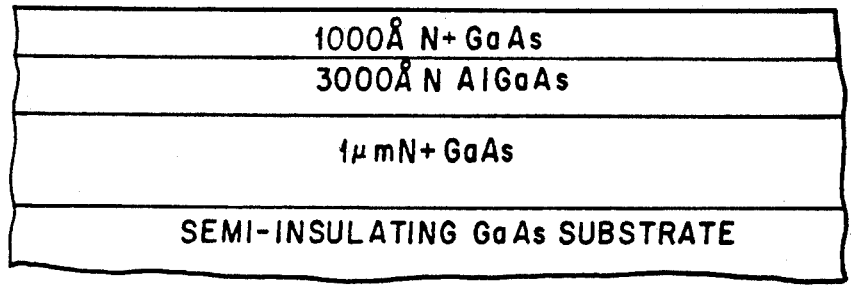
FIGS. 52-57 illustrate the steps of a tenth preferred embodiment method.
Figure 53:
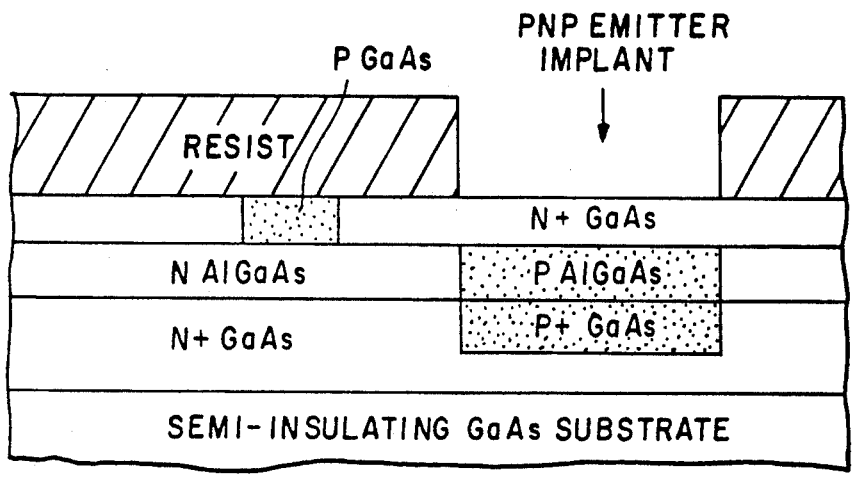
Figure 54:
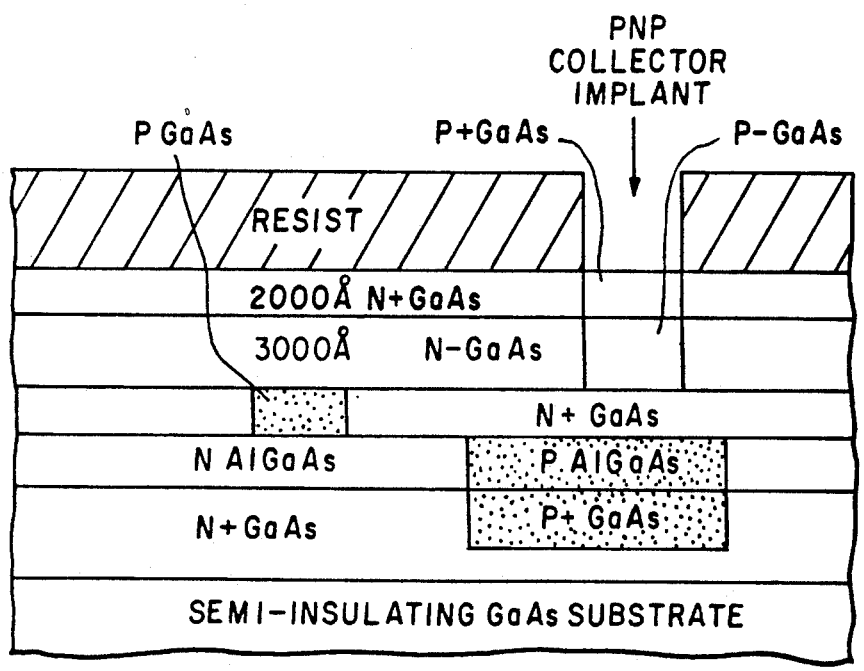
Figure 55:
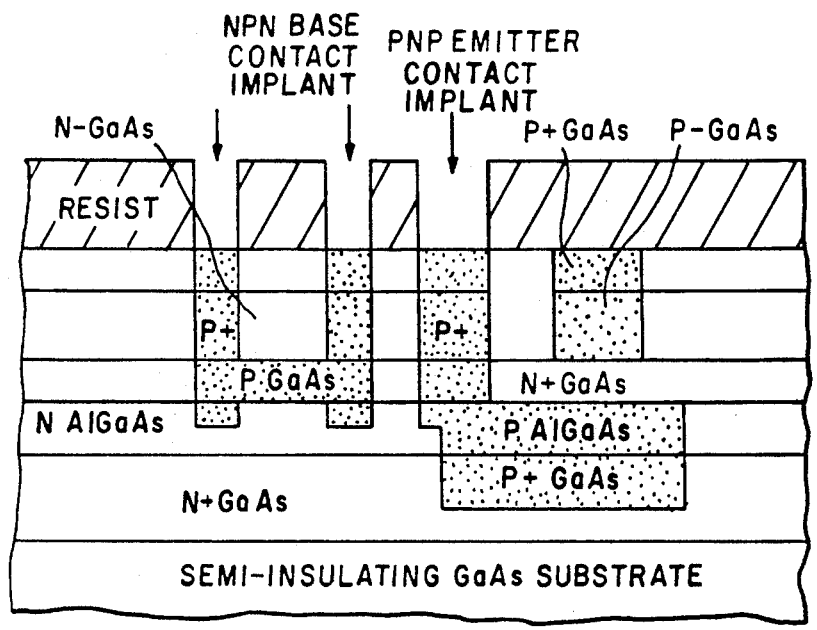
Figure 56:
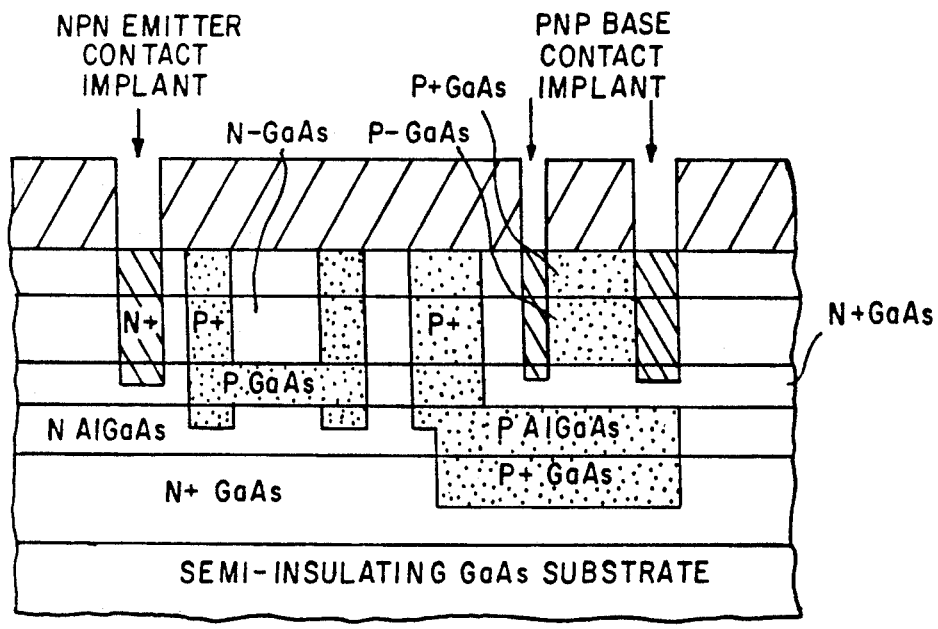
Figure 57:
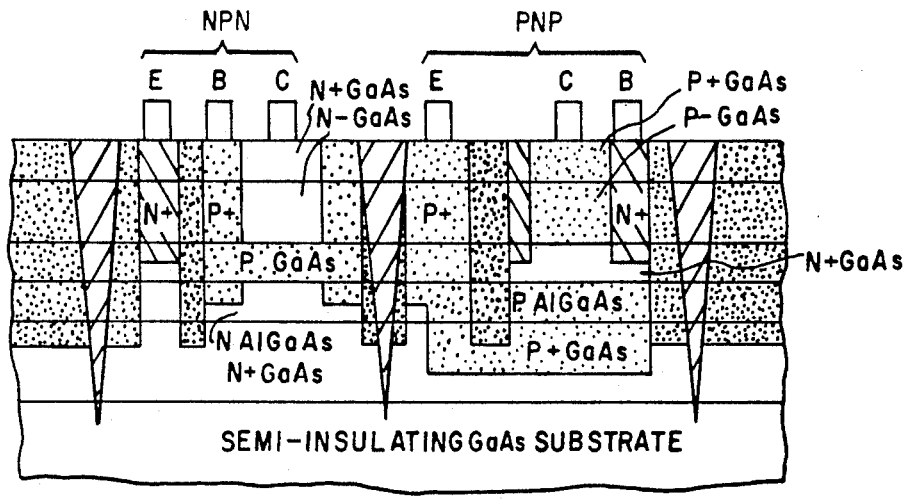

(c) After the ohmic contacts are deposited, the lateral isolation around the isolated emitter NPN and the PNP is done by trench etching and nitride re-fill, FIG. 51, as described in the first preferred embodiment. The subsequent processing for metal interconnection is then standard processing.

(d) Although the Figures illustrate a single isolated NPN transistor, it is possible to combine several NPN transistors by extending the common isolated emitter region for those circuits where the emitters are common. This would minimize the variation in the emitter resistance for such circuits as differential pairs as usual in comparators.

A variation of the ninth preferred embodiment would be to do the epilayer growth of FIG. 50 prior to the implant of FIG. 49. In this variation, the implant would have to be a fairly high energy (about 800 keV for beryllium) to insure that the P type dopants end up below the N type epilayers.

The tenth preferred embodiment uses semi-insulating GaAs instead of N+ GaAs for the substrate of a process similar to the eighth and ninth preferred embodiments. When processed on semi-insulating GaAs the P+ isolation implant into the substrate is unnecessary. The isolated emitter NPN and PNP transistors would be otherwise processed just as described in the eighth and ninth preferred embodiments. FIGS. 52-57 illustrate steps in the tenth preferred embodiment. The common emitter NPNs make contact through the bottom N+ AlGaAs epi layer, the emitter. This emitter is contacted by N+ implants so that the HI²L emitter contact is from the top surface as used in the first seven preferred embodiments, rather then the backside.

The eleventh preferred embodiment has instead of the NJFET, or in addition to the NJFET, a MESFET. The MESFET is made just like the NJFET until the P+ gate implant, FIG. 46. At this point instead of the P+ gate implant the GaAs N+ layer is etched away down to the N− NPN collector layer. This enables the Schottky gate to form on lightly doped N− GaAs which results in a good Schottky diode and good MESFET characteristics. Additionally, instead of putting a P−ohmic contact onto the gate as in the NJFET, a Schottky metal is deposited, like TiPtAu. A threshold adjusting implant can be incorporated to yield both enhancement and depletion mode MESFETs. The entire integration possibilities are then NPN (common emitter), NPN (isolated emitter), PNP, NJFET, PJFET, and MESFET.

The twelfth preferred embodiment includes integration of emitter-up HBTs (first seven preferred embodiments) and the emitter down HBTs (preferred embodiments eight through eleven). This integration is accomplished by replacing the 4,000 Å N− GaAs layer, FIG. 42, deposited during the second epi deposition with 4,000 Å N− AlGaAs layer with the associated graded bandgap layrs. This AlGaAs layer would act as the emitter for the emitter-up HBTs. Otherwise the process could remain identical to embodiment ten. This structure permits any NPNs to be used in either emitter-up or emitter-down mode. For device preformancee improvements, the NPN base implant mask could be divided into two masks: one for the NPN emitter-up and one for the NPN emitter-down transistors. By fabricating these double heterojunction structures, the offset voltage $V_{CEsat}$ can be minimized which further improves performance.

Figure 58:
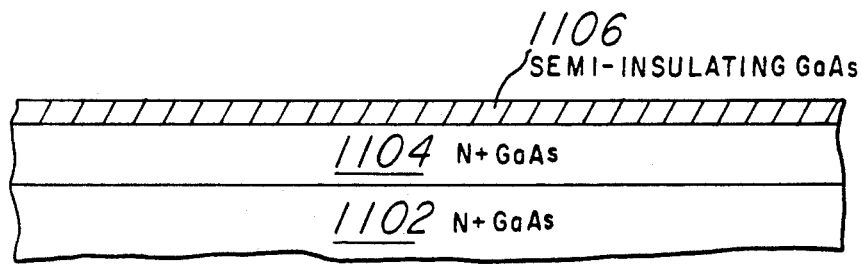
Figure 59:
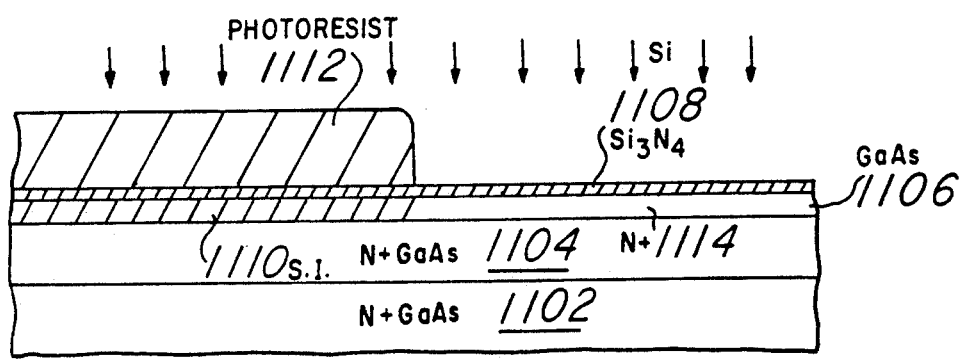
Figure 62:
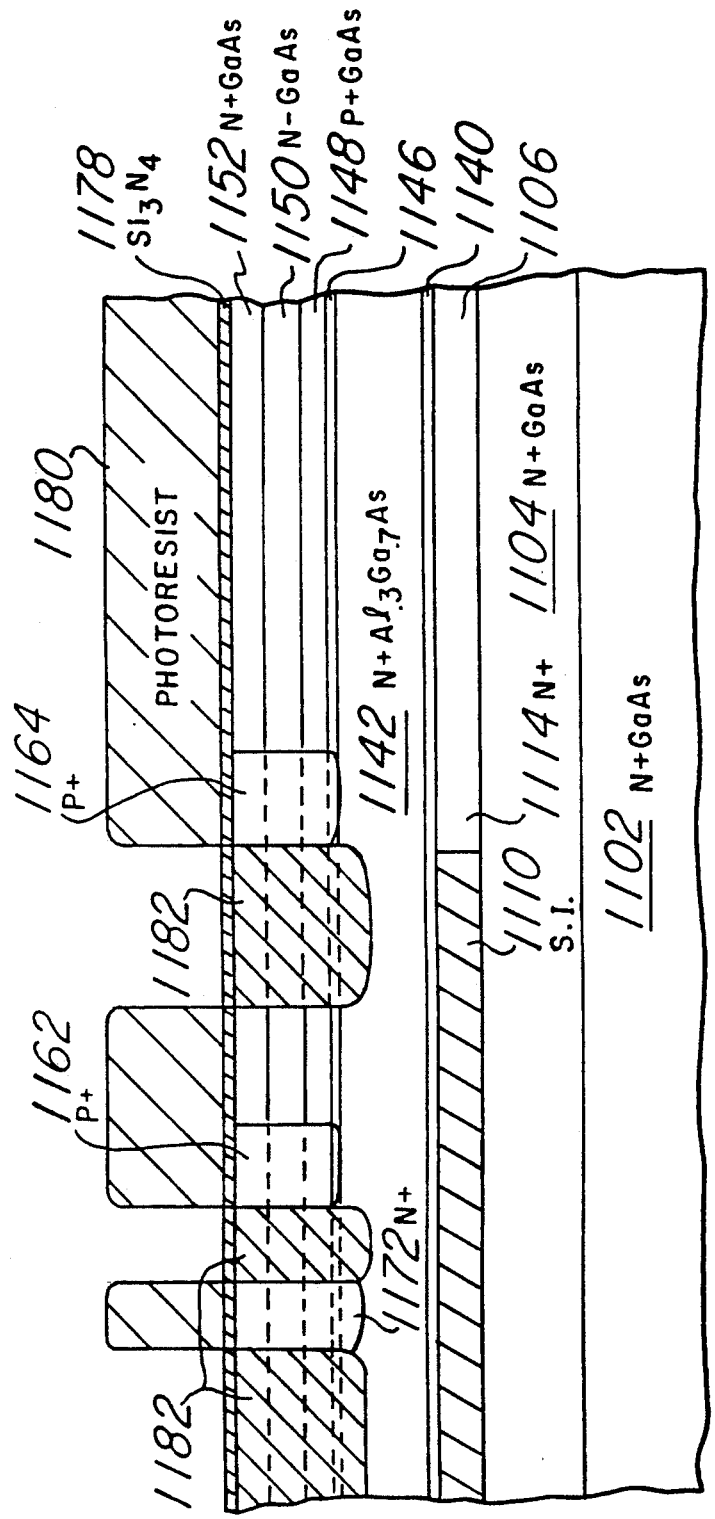
Figure 63:
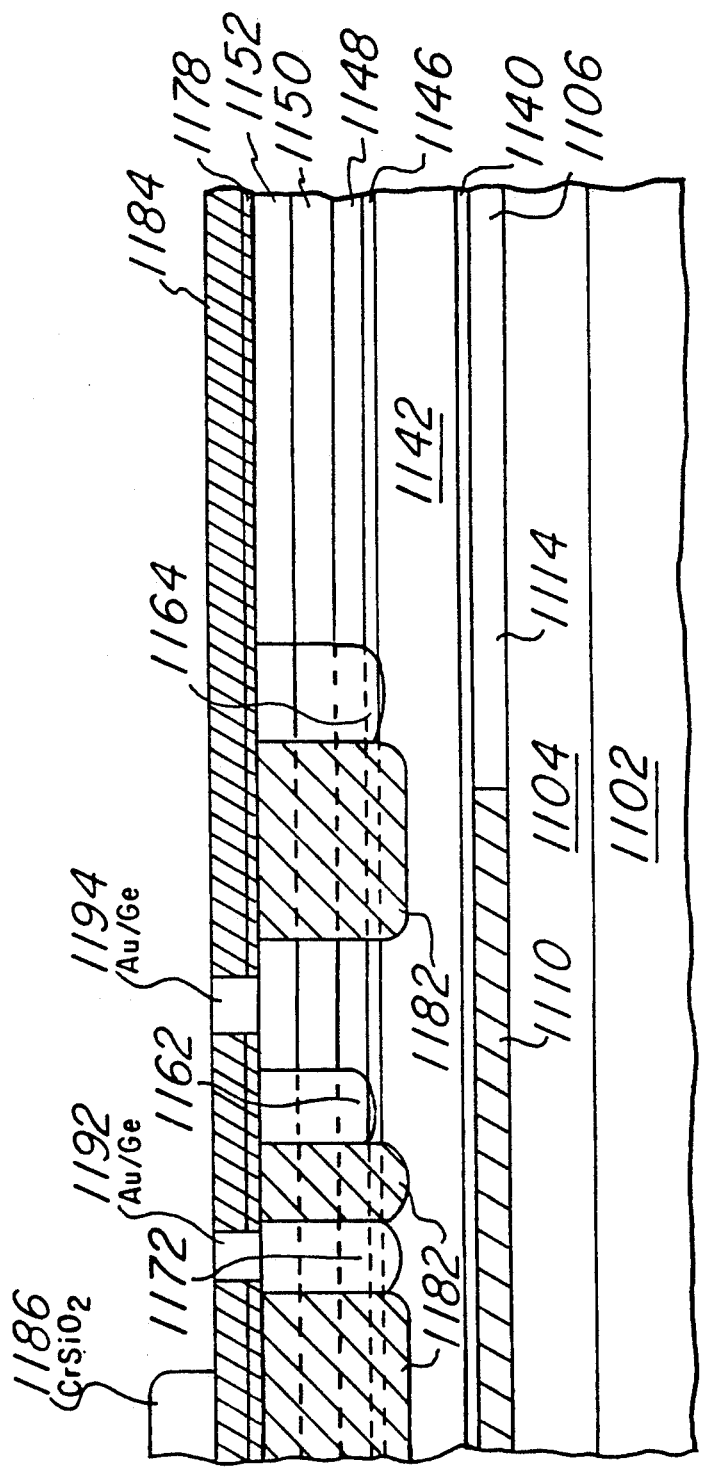
Figure 64:
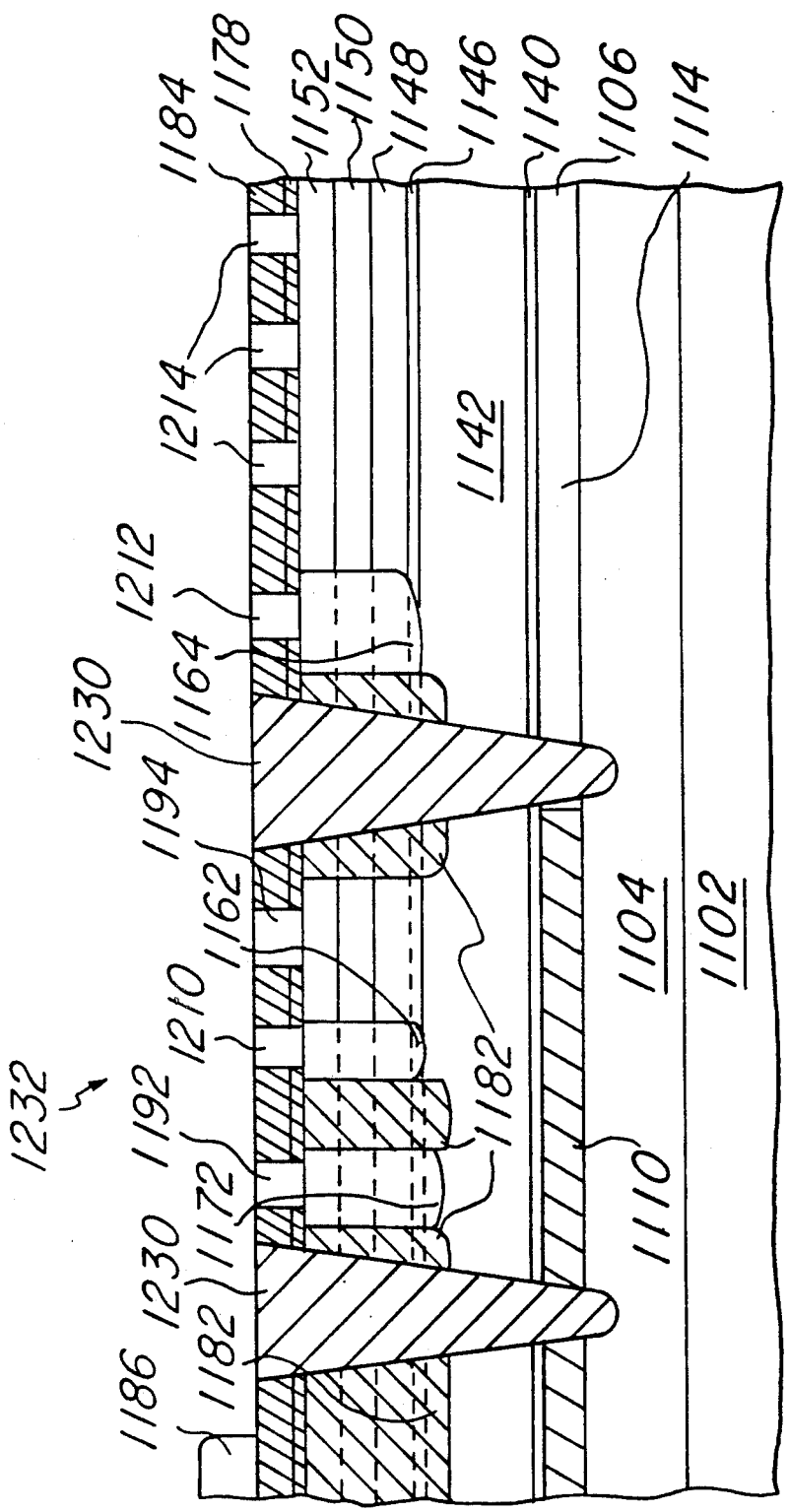
Figure 65:
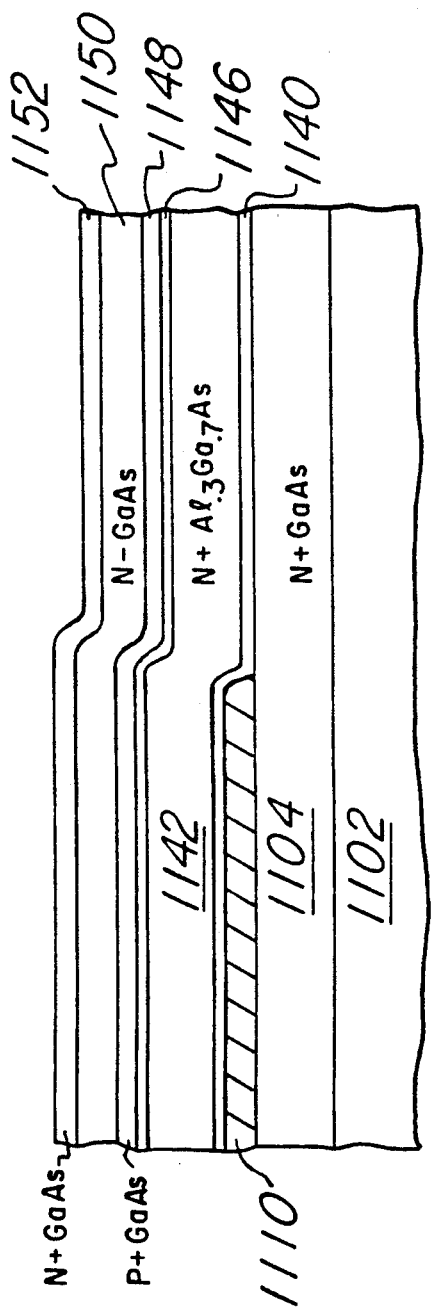
FIG. 65 is a cross sectional elevation view of a variant of the thirteenth preferred embodiment.

Thirteenth preferred embodiment method for simultaneously fabricating common emitter-down heterojunction bipolar transistors (as for HI²L) and isolated emitter-down heterojunction bipolar transistor (HBTs) includes the following steps as illustrated in cross sectional elevation views in FIGS. 58-65:

(a) A starting material for this process in shown in FIG. 58. It is composed of an N+ GaAs substrate 1102 on which approximately 1.0 μm thick layer 1104 of N+ GaAs and 0.5 μm thick layer 1106 of semi-insulating or P− GaAs are epitaxially grown by metalorganic chemical vapor deposition (MOCVD). Layer 1106 will form an isolation layer for the isolated emitter HBTs and the layer 1104 doping is typically $2 \times 10^{18}$/cm3 but any value in excess of about $2 \times 10^{17}$/cm3 could be used. The thickness and doping (if any) of layer 1106 is determined by the isolation resistance and breakdown voltage requirements of the isolated emitter HBTs. Increasing the thickness tends to increase the breakdown voltage while increasing the emitter resistance for the HI²L transistors. A trade-off analysis is needed for each specific application. Note that FIG. 58 and all of the Figures have the vertical exaggerated for clarity; for example, the intrinsic base of an isolated emitter HBT would have an area of about seven μm by seven μm but a thickness of less than 0.2 microns (see step (c) below).

(b) The layered substrate is then coated with a 400 Å thick layer of silicon nitride (Si₃N₄) 1108, photoresist is spun on and patterned and nitride 1108 is plasma etched with the patterned photoresist as etch mask in regions where alignment marks are to be formed. The photoresist mask is then removed. The alignment marks are not shown in

| Layer | Thickness | Description/Function |
|---|---|---|
| 1140 | 300A | graded $Al_xGa_{1-x}As$ region in which the aluminum composition x is varied from zero to 0.3 and the silicon doping is held constant at $2 \times 10^{17}$/cm³. The function is to smooth the bandgap transition between GaAs and AlGaAs |
| 1142 | 10,000A | N-type $Al_xGa_{1-x}As$ layer with x = 0.3 doped with silicon to $2 \times 10^{17}$/cm³. This layer forms the emitter for all of the HBTs, both isolated emitter and HI²L common emitters. |
| 1146 | 200A | graded undoped $Al_xGa_{1-x}As$ with aluminum concentration varied between 0.3 at the previous N—$Al_xGa_{1-x}As$ surface to 0.0. The function is to smooth the bandgap transition between AlGaAs and GaAs. |
| 1148 | 1000A | P-type GaAs layer concentration doped with $2 \times 10^{17}$/cm³ zinc. This layer forms the intrinsic base for all of the HBTs. |
| 1150 | 3000A | N-type GaAs doped with $2 \times 10^{16}$/cm³ silicon. This forms the collectors of all of the HBTs. |
| 1152 | 1000A | N-type GaAs doped with $2 \times 10^{17}$/cm³ silicon. This layer is used to make ohmic contact to the collectors of all of the HBTs. |

All of these layer thicknesses and doping densities are only given as examples. Increases or decreases in the layer thickness by a factor of five or more are well within the useful range. N−type doping densities for the various layers in the range of $1 \times 10^{17}$/cm³ to $2 \times 10^{18}$/cm³ and P−type doping densities in the range of $1 \times 10^{17}$/cm³ to $2 \times 10^{19}$/cm³ can be used to optimize the various device parameters. The doping is done in situ during the growth. See FIG. 60.

(g) After the growth of the epitaxial layers 1140, 1142, . . . , 1152 is completed, the layered substrate is again coated with 400 A thick nitride layer 1158. The substrate is then patterned with photoresist 1160 which exposes the extrinsic base areas all of the HBTs. A P−type dopant such as beryllium is implanted through the nitride layer 1158 using photoresist 1160 as a mask to form heavily doped P+ region 1162 extending from the surface down to layer 1148 for the isolated emitter HBTs and P+ region 1164 extending from the surface down to layer 1148 for the HI²L HBTs. This implant may be composed of several different implants with different energies and doses to tailor the profile to insure a high surface p-type dopant concentration for good ohmic contacts. See FIG. 61. The depth of regions 1162 and 1164 is about 0.5 μm, so beryllium may be implanted at energies up to 200 keV and doses of about $5 \times 10^{14}$/cm².

(h) Photoresist 1160 is then stripped from the layered substrate, and it is patterned with photoresist 1170 exposes the top surface emitter contact areas for the isolated emitter HBTs. An N−type dopant such as silicon is implanted through the nitride layer 1158 using photoresist 1170 as a mask to form heavily doped N+ region 1172 extending from the surface down to $Al_xGa_{1-x}As$ layer 1142 for the isolated emitter HBTs. The depth of region 1172 is about 0.6 μm, so silicon may be implanted at energies up to 400 keV or more; note that the does of the implant will depend upon the doping level of layer 1148 because it must be converted from P+ to N+.

(i) The remaining photoresist 1170 and nitride 1158 are then stripped from the layered substrate and a new 400 A thick conformal plasma nitride layer 1178 is deposited.

(j) The P+ implant of step (j) and N+ implant of step (h) are annealed, typically in a rapid thermal annealer although a furnace anneal could be used. The use of the rapid thermal annealer (RTA) provides good activation while limiting the time at elevated temperatures to less than a few minutes to minimize the movement of the dopants due to diffusion. A two step RTA process as disclosed in U.S. Pat. No. 4,743,569 is used for this anneal process.

(k) The layered substrate is patterned with photoresist 1180 for isolation implant. Photoresist 1180 covers only the active regions of the various transistors, and boron is implanted through nitride 1178 with photoresist 1180 as implant mask; the implant damages the GaAs/AlGaAs crystal lattice in regions not protected by photoresist 1180 and converts the implanted regions to semi-insulating regions 1182. The regions 1182 extend to a depth of about 0.8 μm and separate N+ region 1172 from P+ region 1162; see FIG. 62.

(l) Photoresist 1180 is stripped and the layered substrate is then cleaned and a new conformal plasma nitride layer 1184 (2000–3000 A thick) is deposited. A 1000 A thick layer 1186 of resistive material such as cermet ($CrSiO_2$) is sputtered onto the nitride 1184, annealed using the rapid thermal annealer, and patterned and etched to form required resistors. After the anneal the sheet resistance of the cermet 1186 is approximately 300 ohms/square although other materials and sheet resistances can be used depending on the circuit requirements.

(m) Photoresist mask layer 1190 is then patterned on the layered substrate exposing nitride 1178/1184 in all of the regions where it is desired to form ohmic contacts to the N−surface regions including the isolated emitter and collector; the HI²L emitters are brought to the surface in the periphery of the substrate by a via similar to emitter contact 1172 and the HI²L collectors are Schottky barriers and formed later. The HI²L emitter contact can also still be made to the backside of the wafer to maintain a low emitter resistance and good transistor packing density. Nitride 1178/1184 is removed from these regions using a plasma etch of $CF_4/O_2$ with photoresist 1190 as etch mask. Following the etch a wet chemical clean-up is used which maintains photoresist 1190 intact. A gold/germanium (or other contact metal system) ohmic contact metallization is deposited onto the layered substrate and using a photoresist 1190 assisted lift-off: the ohmic metal is removed except in regions where the contact openings have been etched in the nitride. Using a rapid thermal annealing process, the contact metal is annealed at 380–500 C. and forms isolated emitter contacts 1192 and collector contact 1194; see FIG. 63.

(n) The layered substrate is patterned with photoresist 1208 which exposes the regions in which P−type ohmic contacts are to be made which includes all of the base regions, both isolated emitter HBTs and HI²L HBTs. Nitride 1178/1184 is plasma etched followered by a contact clean-up. This is followed by a P−ohmic metallization process similiar to the previously described N−ohmic process except that the deposited metal is a combination of layers of gold/zinc. This forms base contacts 1210 and 1212. The temperature used for the contact anneals and cermet anneals are sufficiently low temperature that the implant damage used to convert the field area to semi-insulating is not annealed out. If higher anneal temperatures are need for other metallization systems or resistor materials, the boron damaging implant can be delayed in the process until after all the heat cycles have been completed.

(o) The contact metal system is again repeated in regions where Schottky barrier diodes are to be fabricated such as the HI²L collector contacts 1214. Titanium followed by platinum and gold is deposited and lifted off using the previously described process. No contact anneal is used for the case of the Schottky diodes.

(p) At this point in the process the emitters of all of the HBTs are connected together through the emitter layer 1142. To isolate the various transistors, narrow 1–2 micron wide moat (trench) will be etched through the various epi layers into the semi-insulating portion 1110 of GaAs layer 1106 completely encircling each of the isolated emitter HBTs. (Note: More than one transistor can be placed inside the same moat to save area if the transistors do not need to be electrically isolated from each other). The trench is then filled in with nitride so that metal interconnect can be used to connect the various transistors together into the required circuit. A sufficiently high energy implant could also give damage to the necessary depth to replace the trench process, such as a few MeV oxygen. This trench process may accomplished in the following manner.

(p.1) Following the ohmic and Schottky metal processes, the layered substrate is coated with a 500 A layer of plasma nitride to protect the previous metal depositions. A layer of aluminum is then deposited. Using photoresist, the trench mask is patterned over the aluminum. The back side of the layered substrate is protected and the aluminum is etched from the trench region. The exposed nitride (typically 3500 A thick) is plasma etched from the trench region. Using the photoresist as a mask the exposed GaAs is ion milled to a depth (typically 2 μm) which exceeds the total thickness of the epitaxial layers. The resist is then removed. Nitride and/or oxide can be used in lieu of the aluminum for masking during the trench etch.

(p.2) After etching the trench with the ion mill, the layered substrate is cleaned and the trench and aluminum layer are coated with a thick layer of plasma nitride (typically 10,000–15,000 A). This nitride is ion milled at 75 degrees off axis to remove the nitride from the aluminum surface. This process yields only a partially planarized surface and the trench is only partially filled.

(p.3) Using repetitive process cycles in which depositions of nitride is followed by unpatterned layers of photoresist and reactive ion etching processes in which the etch rate for the photoresist and nitride are approximately equal, the trench is filled with nitride. The aluminum layer acts as an etch stop which prevents the underlying nitride from being etched during the RIE etch process. After two repetitions of this process the surface is essentially planar. After the planarization process the aluminum is stripped from the layered substrate. See FIG. 64 which shows a trench 1230 encompassing the isolated emitter HBT 1232.

(q) The layered substrate is then cleaned and 6000–8000 A of plasma oxide is deposited over the nitride. Photoresist is patterned and the first vias are etched down to the ohmic metal. From this point on a standard two-level metal process is used to complete the fabrication of the required circuits.

This concludes the description of the thirteenth preferred embodiment process. Doping levels and film thicknesses specified are typical and variations of the parameters in order to optimize the process for a specific application are included modifications. As an example, if the semi-insulating layer 1106 is 0.5 μm thick and the area of the emitter for isolated emitter HBT 1232 is 20 μm by 50 μm, then the resistance through the portion 1110 of isolation layer 1106 is about 5MΩ.

A variant of the thirteenth preferred embodiment replaces the N+ implant of step (c) of the first preferred embodiment with an etching of layer 1106 in areas where HI²L HBTs are to be fabricated. Thus the second epi deposition of the $Al_xGa_{1-x}As$ and GaAs layers 1140, 1142, ..., 1152 would be made on a nonplanar surface; the height of the step of course depends upon the thickness of layer 1106. See FIG. 65 which shows a cross sectional elevation view after the second epi deposition. Note that the step occurs in the location of the eventual trench isolation, so it does not disrupt device fabrication.

The various preferred embodiments described infra may be approximately summarized as follows:

| Pref. Embod. | Summary |
|---|---|
| 1 | Integration of NPN and PNP bipolars with PJFETs and NJFETs utilizing implanted base with overgrowth emitter PNP, implanted collector with overgrowth base and emitter PNP, implanted backgate with overgrowth channel and gate NJFET, and implanted channel with overgrowth gate PJFET. |
| 2 | Same as first preferred embodiment but with a first overgrowth base for the NPN and backgate for the NJFET which is patterned and etched. |
| 3 | Same as either the first or second preferred embodiment but with an extra epi deposition to have a P+ buried layer (subcollector) for the PNP. |
| 4 | Utilization of isolated, implanted buried collector regions of the NPNs and PNPs and then the same as either the first or second preferred embodiment but with an extra epi deposition. |
| 5 | Integration of NPNs and PNPs and NJFETs and PJFETs utilizing a single epi deposition process by means of mesa etching. |
| 6 | Utilization of the AlGaAs sacrificial spacer layer for optimizing the base implant profiles and annealing behavior in the first preferred embodiment. |
| 7 | Integration by first preferred embodiment of emitter-up NPNs and PNPs utilizing AlGaAs/GaAs double hetereojunction for fabricating the emitters and collectors for improved performance. |
| 8 | Integration of emitter-down NPNs and PNPs with JFETs utilizing N+ substrates; the NPNs are connected in common emitter configuration to the N+ substrate while the PNPs and JFETs are individually isolated. |
| 9 | Integration of emitter-down NPNs and PNPs with JFETs utilizing N+ substrates permitting isolated NPNs, PNPs and JFETs as well as NPNs with their emitters connected to the N+ substrates as in HI²L; a variation of the eighth preferred embodiment. |
| 10 | Integration of emitter-down NPNs and PNPs with JFETs utilizing semi-insulating substrates permitting isolated NPNs, PNPs and JFETs while similar to the eighth and ninth preferred embodiments. |
| 11 | Integration of MESFETs with NPNs, PNPs, and JFETs with the eighth preferred embodiment. |
| 12 | Integration of emitter-down NPNs and PNPs with emitter-up NPNs and JFETs utilizing semi-insulating substrates permitting isolated emitter-down NPNs and PNPs, emitter-up NPNs and JFETs. |
| 13 | Integration of isolated emitter-down with HI²L. |

Figure 66A:
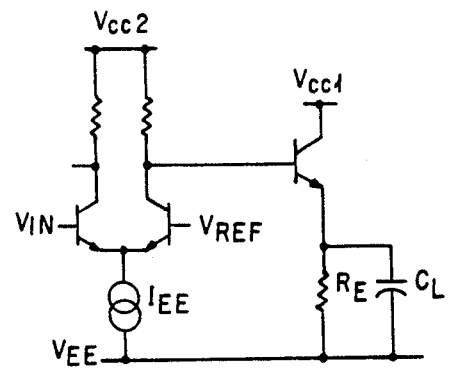
FIGS. 66-67 show schematics of completed integrated circuits applying preferred embodiments.
Figure 66B:
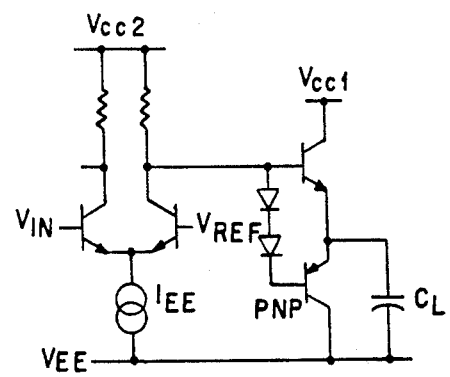

FIG. 66 shows in schematic view an application of integrated NPN and PNP HBTs in an emitter coupled logic (ECL) gate; part (a) shows the conventional ECL gate which uses only NPNs plus resistors and a capacitor and part (b) shows the use of a PNP in place of the emitter resistor $R_E$. For the conventional ECL design, the NPN emitter follower transistor represents a low impedance source for rapidly charging this load capacitance. During the discharge cycle, the emitter follower turns off, leaving only the emitter resistor to discharge the capacitance. The RC time constant can be substantial, because to lower the value of the emitter resistance to lower the RC product results in a proportional increase in the gate power consumption. Contrarily, the use of a PNP load results in an active emitter follower for both the charging and discharging cycles. During the discharge cycle, the PNP low "on" impedance results in a rapid discharge of the output node load capacitance.

Figure 67:
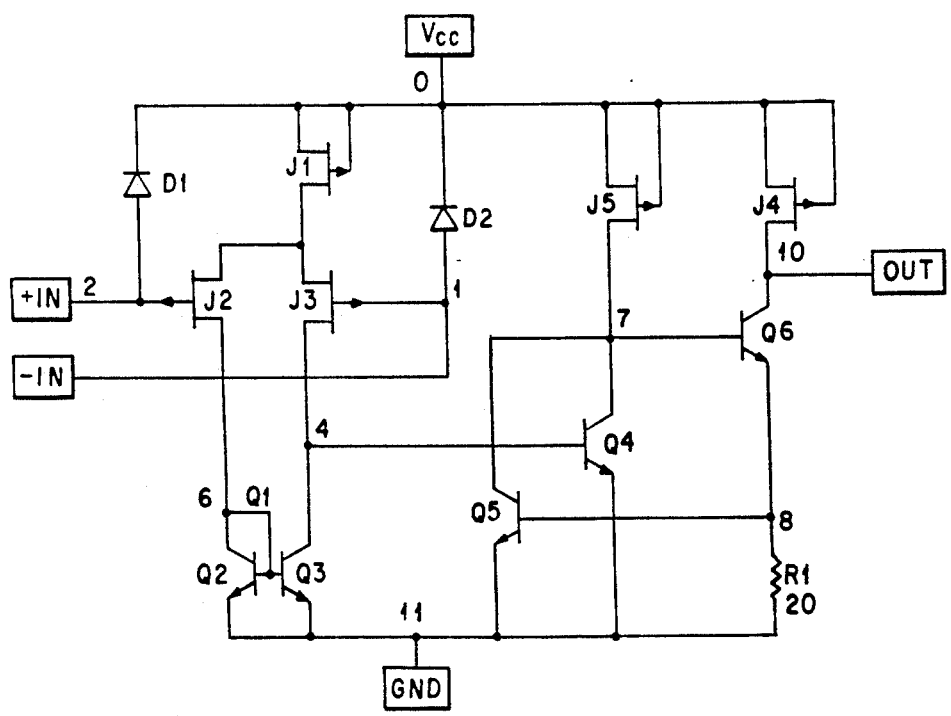

FIG. 67 shows in schematic view an application of integrated NPNs and PJFETs in an operational amplifier (opamp). The advantages of the integration are that the PJFETs provide high input impedance while the HBTs provide large current handling capabilities. In addition, the PJFETs provide efficient low voltage current sources which can be used as active loads for the HBTs resulting in large voltage gains and lower power requirements than can be obtained with the use of only NPN HBTs and resistors.

MODIFICATIONS AND ADVANTAGES

Various modifications of the preferred embodiment devices and methods may be made while retaining the features of the multiple epi overgrowth process for integrating NPNs, PNPs, JFETs, and MESFETs.

For example, doping levels and epi layer thickness given indicate a general value which may be increased or decreased by an order of magnitude for optimization for a particular application. All of the N type doped regions can be interchanged with the P type doped regions and the fabrication procedures follow, in general, the preferred embodiments resulting in PNP devices replacing the NPNs and vice versa. The NPN grown base process of the second preferred embodiment can be used in lieu of the implanted NPN base described in the remaining preferred embodiments. The process allows one to pick and choose which of the preferred embodiments and described devices one wishes to integrate to optimize the circuit performance and/or cost.

The invention provides the advantages of integrating both NPN and PNP bipolar technologies with FET technologies, either JFET or MESFET, and to take full advantage of the characteristics of each. For example, the FETs can be used to increase the input impedance of an amplifier while the bipolar devices can supply the necessary current drive both internal to the circuit and for high current, high speed I/O requirements. The MESFETs and/or JFETs can expeditiously be used in memory circuit storage cells while the bipolar devices due to their higher speeds and lower operating voltages can be used for sense amplifiers and driver circuits. The NPN and PNP transistors can be combined in circuits to provide a complementary pair to minimize the circuit power requirements. In a similar manner, the NPNs can be combined with P—channel JFETs or PNP combined with N—channel JFETs for low voltage, low power applications. The FETs can be used as constant current sources to supply the bipolar circuits in such applications as digital-to-analog converters and analog-to-digital circuits.

Most of the preferred embodiments described results in an essentially planar surface which results in higher yield for LSI and VLSI applications. The planar surface also improves the reliability of the metal interconnect by minimizing the thinning as the metal runs over the topography one obtains in the more conventional GaAs double mesa processes.

What is claimed is:

1. A method of fabricating an integrated circuit, comprising the steps of:
   (a) providing a first layer of a group III–V semiconductor material;
   (b) implanting dopants of a first conductivity type into spaced apart regions of said first layer of semiconductor material;
   (c) forming a second layer of group III–V semiconductor material of opposite conductivity type on said first layer;
   (d) forming at least two transistors of different types taken from the group consisting of NPN heterojunction bipolar, PNP heterojunction bipolar, N—channel field effect and P—channel field effect, each of said transistors including a region of said implanted dopants and a region of said second layer; and
   (d) forming an electrical coupling between said transistors.

2. The method of claim 1 further including the step of forming a third layer of group III–V semiconductor material of said first conductivity type on said second layer.

3. The method of claim 2 wherein at least one of said at least two transistors is taken from the group consisting of PNP heterojunction bipolar and N—channel field effect disposed in part in said third layer.

4. The method of claim 3 further including the step of electrically isolating said transistors from each other within said semiconductor material.

5. The method of claim 2 wherein said third layer is formed by providing a fourth region adjacent said first layer of graded $Al_xGa_{1-x}As$ wherein x is varied from zero to 0.3, a fifth region over said first region of $Al_xGa_{1-x}As$ wherein x is 0.3 and a sixth region over said second region of GaAs.

6. The method of claim 5 further including the step of electrically isolating said transistors from each other within said semiconductor material.

7. The method of claim 2 further including the step of electrically isolating said transistors from each other within said semiconductor material.

8. The method of claim 1 wherein said first layer is formed of GaAs.

9. The method of claim 8 wherein said second layer is formed by providing a first region adjacent said first layer of graded $Al_xGa_{1-x}As$ wherein x is varied from zero to 0.3, a second region over said first region of $Al_xGa_{1-x}As$ wherein x is 0.3 and a third region over said second region of GaAs.

10. The method of claim 9 wherein said third layer is formed by providing a fourth region adjacent said first layer of graded $Al_xGa_{1-x}As$ wherein x is varied from zero to 0.3, a fifth region over said first region of $Al_xGa_{1-x}As$ wherein x is 0.3 and a sixth region over said second region of GaAs.

11. The method of claim 10 further including the step of electrically isolating said transistors from each other within said semiconductor material.

12. The method of claim 9 further including the step of electrically isolating said transistors from each other within said semiconductor material.

13. The method of claim 8 further including the step of electrically isolating said transistors from each other within said semiconductor material.

14. The method of claim 1 wherein said second layer is formed by providing a first region adjacent said first layer of graded $Al_xGa_{1-x}As$ wherein x is varied from zero to 0.3, a second region over said first region of $Al_xGa_{1-x}As$ wherein x is 0.3 and a third region over said second region of GaAs.

15. The method of claim 14 further including the step of electrically isolating said transistors from each other within said semiconductor material.

16. The method of claim 1 further including the step of electrically isolating said transistors from each other within said semiconductor material.

* * * * *